(12) United States Patent
Hopkins

(10) Patent No.: US 11,251,369 B2
(45) Date of Patent: Feb. 15, 2022

(54) SEMICONDUCTOR CONSTRUCTIONS

(71) Applicant: Micron Technology, Inc., Boise, ID (US)

(72) Inventor: John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/857,422

(22) Filed: Dec. 28, 2017

(65) Prior Publication Data

US 2018/0219153 A1 Aug. 2, 2018

Related U.S. Application Data

(62) Division of application No. 13/759,707, filed on Feb. 5, 2013, now Pat. No. 10,546,998.

(51) Int. Cl.
*H01L 45/00* (2006.01)
*H01L 27/24* (2006.01)

(52) U.S. Cl.
CPC ............ *H01L 45/06* (2013.01); *H01L 27/249* (2013.01); *H01L 27/2427* (2013.01); *H01L 45/1226* (2013.01); *H01L 45/144* (2013.01)

(58) Field of Classification Search
CPC .................................................. H01L 27/0688
See application file for complete search history.

(56) References Cited

U.S. PATENT DOCUMENTS

| 7,646,630 B2* | 1/2010 | Lowrey | G11C 13/0004 326/39 |
| 2009/0321878 A1* | 12/2009 | Koo | H01L 27/101 257/536 |
| 2011/0140068 A1* | 6/2011 | Ozawa | H01L 27/249 257/4 |
| 2011/0186851 A1* | 8/2011 | Son | H01L 27/11582 257/60 |
| 2011/0266656 A1* | 11/2011 | Yun | H01L 21/561 257/620 |
| 2011/0299314 A1* | 12/2011 | Samachisa | G11C 13/003 365/51 |
| 2011/0316063 A1* | 12/2011 | Tang | H01L 27/0688 257/314 |
| 2014/0061574 A1 | 3/2014 | Pio | |
| 2014/0061575 A1 | 3/2014 | Pio | |
| 2014/0162418 A1 | 6/2014 | Keshav et al. | |

* cited by examiner

*Primary Examiner* — Steven B Gauthier
*Assistant Examiner* — Christopher A Culbert
(74) *Attorney, Agent, or Firm* — Wells St. John P.S.

(57) ABSTRACT

Some embodiments include constructions having electrically conductive bitlines within a stack of alternating electrically conductive wordline levels and electrically insulative levels. Cavities extend into the electrically conductive wordline levels, and phase change material is within the cavities. Some embodiments include methods of forming memory. An opening is formed through a stack of alternating electrically conductive levels and electrically insulative levels. Cavities are extended into the electrically conductive levels along the opening. Phase change material is formed within the cavities, and incorporated into vertically-stacked memory cells. An electrically conductive interconnect is formed within the opening, and is electrically coupled with a plurality of the vertically-stacked memory cells.

5 Claims, 35 Drawing Sheets

SEMICONDUCTOR CONSTRUCTIONS

RELATED PATENT DATA

This patent resulted from a divisional of U.S. patent application Ser. No. 13/759,707 which was filed Feb. 5, 2013 and which is hereby incorporated by reference herein.

TECHNICAL FIELD

Semiconductor constructions, methods of forming memory, and methods of forming vertically-stacked structures.

BACKGROUND

Memory is one type of integrated circuitry, and is used in computer systems for storing data. Memory cells may be configured to retain or store memory in at least two different selectable states. In some memory cells, the different memory states may correspond to different physical states of a programmable material. For instance, phase change memory (PCM) may utilize ovonic memory materials (e.g., various chalcogenides) as programmable materials in memory cells; with the phase change materials being transformed from one phase to another through application of appropriate electrical stimulus.

The ovonic memory materials may be utilized in combination with selection devices, such as diodes or ovonic threshold switches.

A continuing goal with memory, including PCM, is to increase packing density of the memory across a semiconductor substrate. Accordingly, it is desired to develop new memory architectures, and new methods of forming memory architectures.

DETAILED DESCRIPTION OF THE ILLUSTRATED EMBODIMENTS

In some embodiments, new processing is utilized to form vertically-stacked structures, such as, for example, vertically-stacked PCM cells. Some example embodiments are described with reference to FIGS. 1-35.

Figure 1:
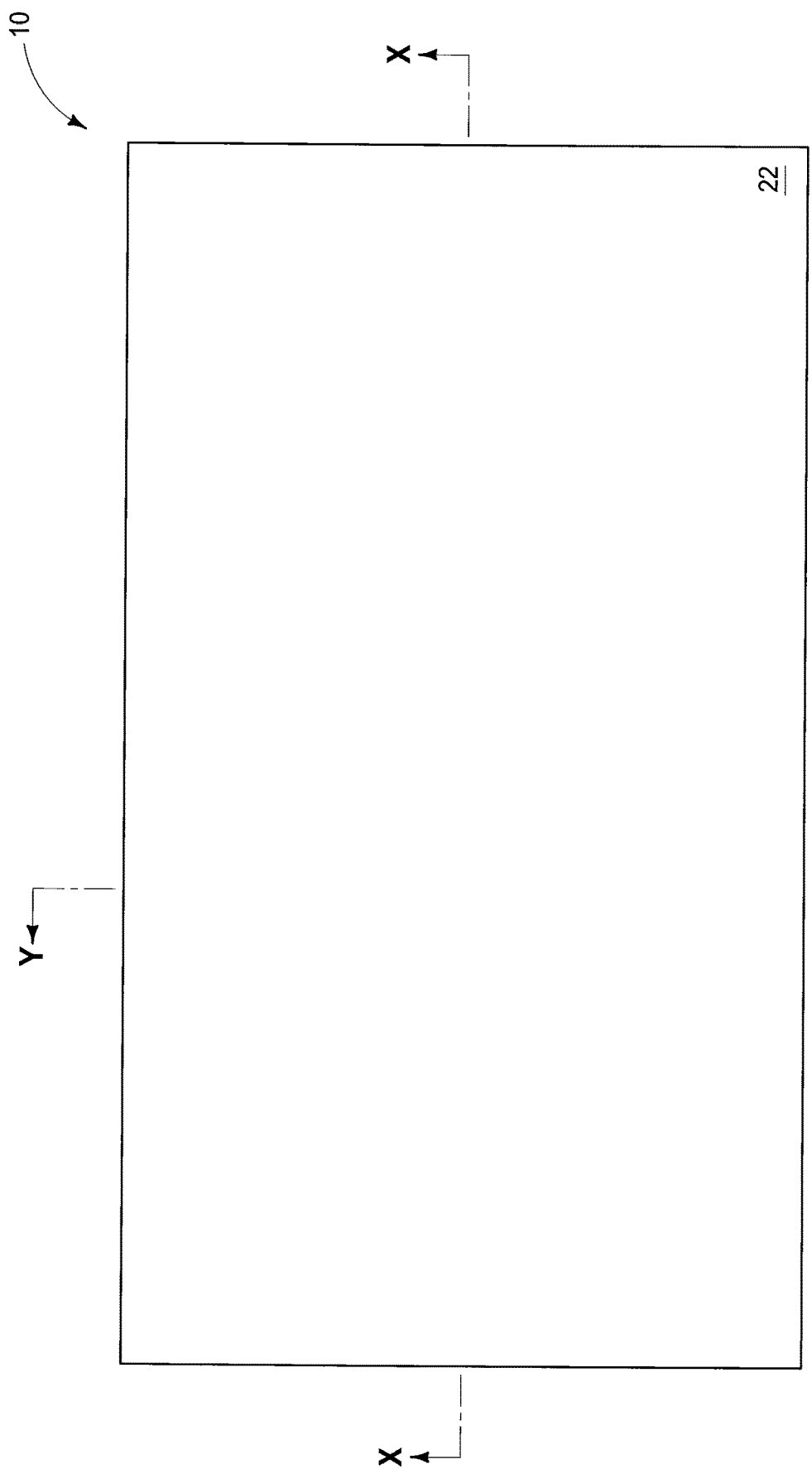
FIGS. 1, 4, 7, 10, 13, 16, 19, 22, 25 and 28 are top views of a portion of a semiconductor construction at various process stages of an example embodiment method of forming vertically-stacked structures; such as, for example, vertically-stacked PCM cells.
Figure 2:
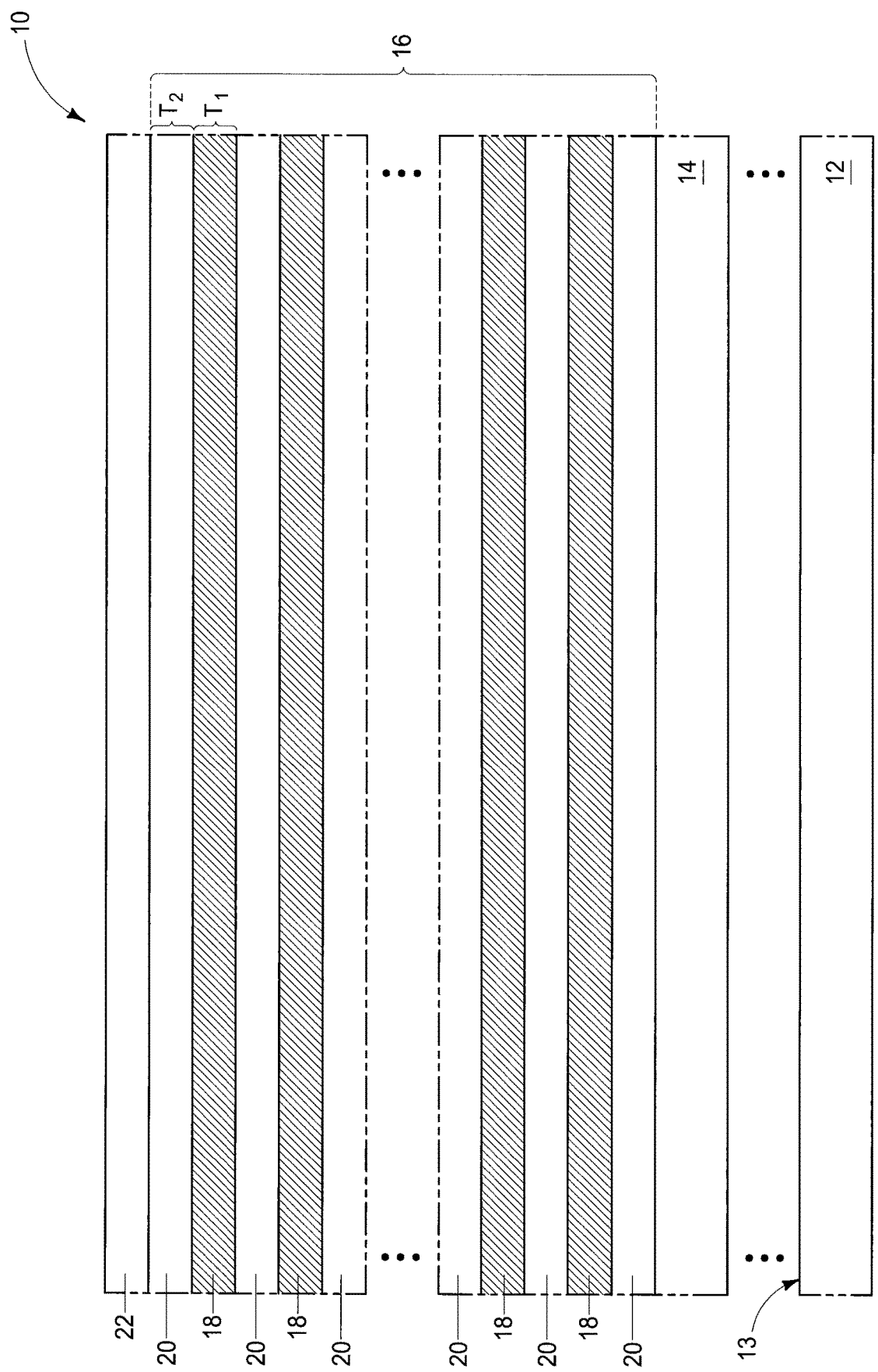
FIGS. 2, 5, 8, 11, 14, 17, 20, 23, 26 and 29 are diagrammatic cross-sectional views along the lines X-X of FIGS. 1, 4, 7, 10, 13, 16, 19, 22, 25 and 28, respectively.
Figure 3:
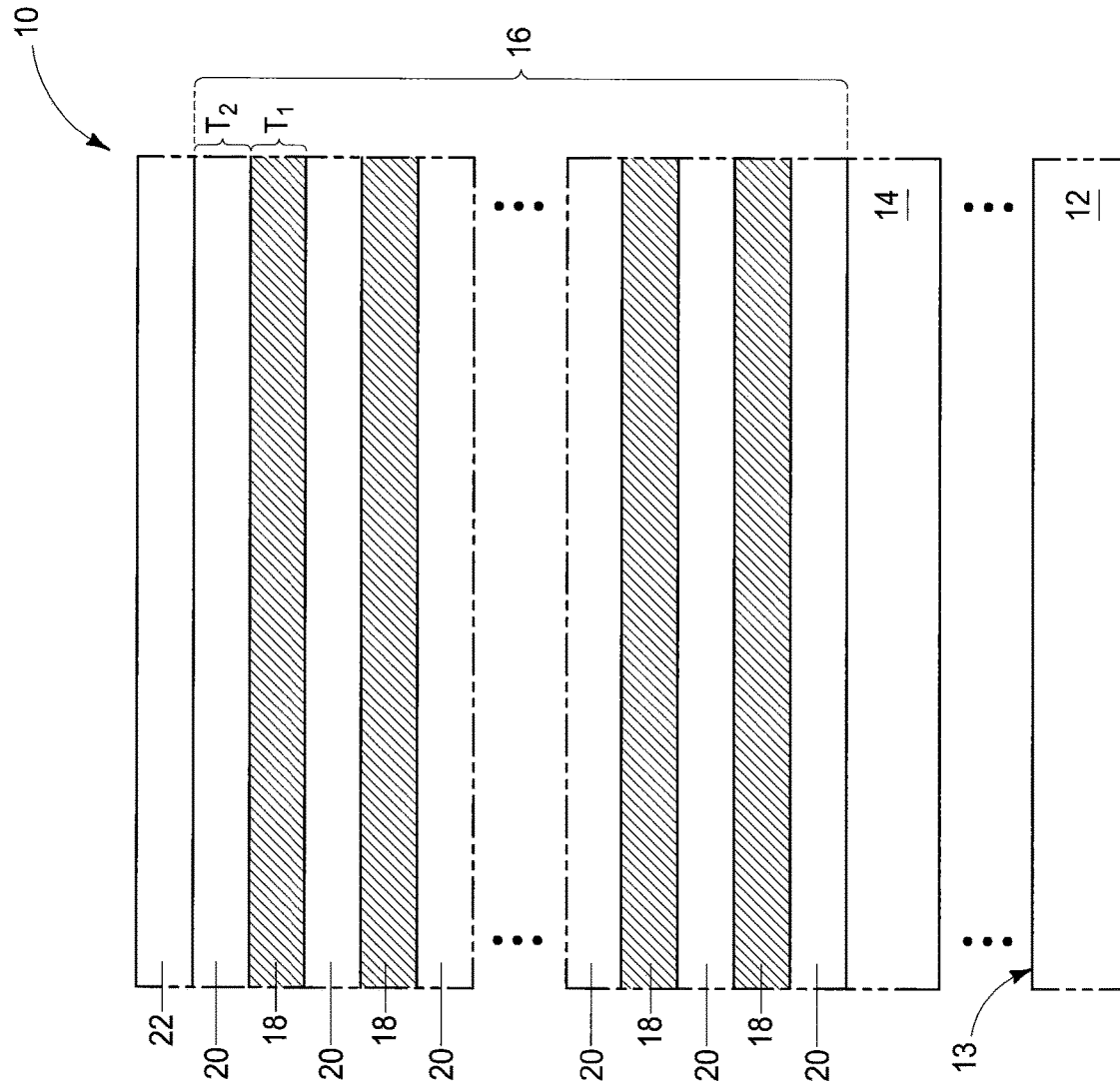
FIGS. 3, 6, 9, 12, 15, 18, 21, 24, 27 and 30 are diagrammatic cross-sectional views along the lines Y-Y of FIGS. 1, 4, 7, 10, 13, 16, 19, 22, 25 and 28, respectively.

Referring to FIGS. 1-3, a semiconductor construction 10 includes an etchstop material 14 supported by a base 12. A break is provided between the etchstop material 14 and the base 12 to indicate that there may be additional materials and/or integrated circuit structures between the base and the etchstop material in some embodiments.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Such materials may include, for example, one or more of refractory metal materials, barrier materials, diffusion materials, insulator materials, etc.

The etchstop material 14 may comprise any suitable composition or combination of compositions; and in some embodiments may comprise, consist essentially of, or consist of aluminum oxide or tungsten silicide.

A stack 16 of alternating electrically conductive levels 18 and electrically insulative levels 20 is formed over the etchstop material 14. The levels 18 and 20 may be of any suitable configuration; including, for example, sheets, layers, etc.

The electrically conductive levels 18 may comprise any suitable electrically conductive material; and in some embodiments may comprise, consist essentially of, or consist of one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, in some embodiments the electrically conductive levels 18 may comprise, consist essentially of, or consist of tungsten.

In some embodiments, the electrically conductive levels 18 may be patterned into wordlines of a memory array. Such example processing may form vertically-stacked memory, with the number of memory cells in each vertical stack being determined by the number of wordline levels. A break is provided within the stack 16 to indicate that there may be more levels in the stack than are shown. The stack may have any number of wordline levels suitable to form a desired structure. For instance, in some embodiments the stack may have 8 wordline levels, 16 wordline levels, 32 wordline levels, 36 wordline levels, 64 wordline levels, 72 wordline levels, etc.

The electrically insulative levels 20 may comprise any suitable composition; and in some embodiments may comprise, consist essentially of, or consist of silicon dioxide.

The electrically conductive levels 18 may be of any suitable thickness ($T_1$), and in some embodiments may have a thickness within a range of from about 5 nm to about 300 nm; such as, for example, a thickness of about 30 nm. The electrically insulative levels 20 may be of any suitable thickness ($T_2$), and in some embodiments may have a thickness within a range of from about 5 nm to about 200 nm; such as, for example, a thickness of about 20 nm.

In the shown embodiment, the base 12 has a substantially horizontal primary surface 13. Some embodiments form vertically-extending structures. The vertically-extending structures may be considered to extend along a vertical direction; or, in other words, to extend along a direction which is substantially orthogonal to the horizontal primary surface 13.

A hardmask material 22 is formed over stack 16. The hardmask material 22 may comprise any suitable composition or combination of compositions; and in some embodiments may comprise, consist essentially of, or consist of silicon nitride.

Figure 4:
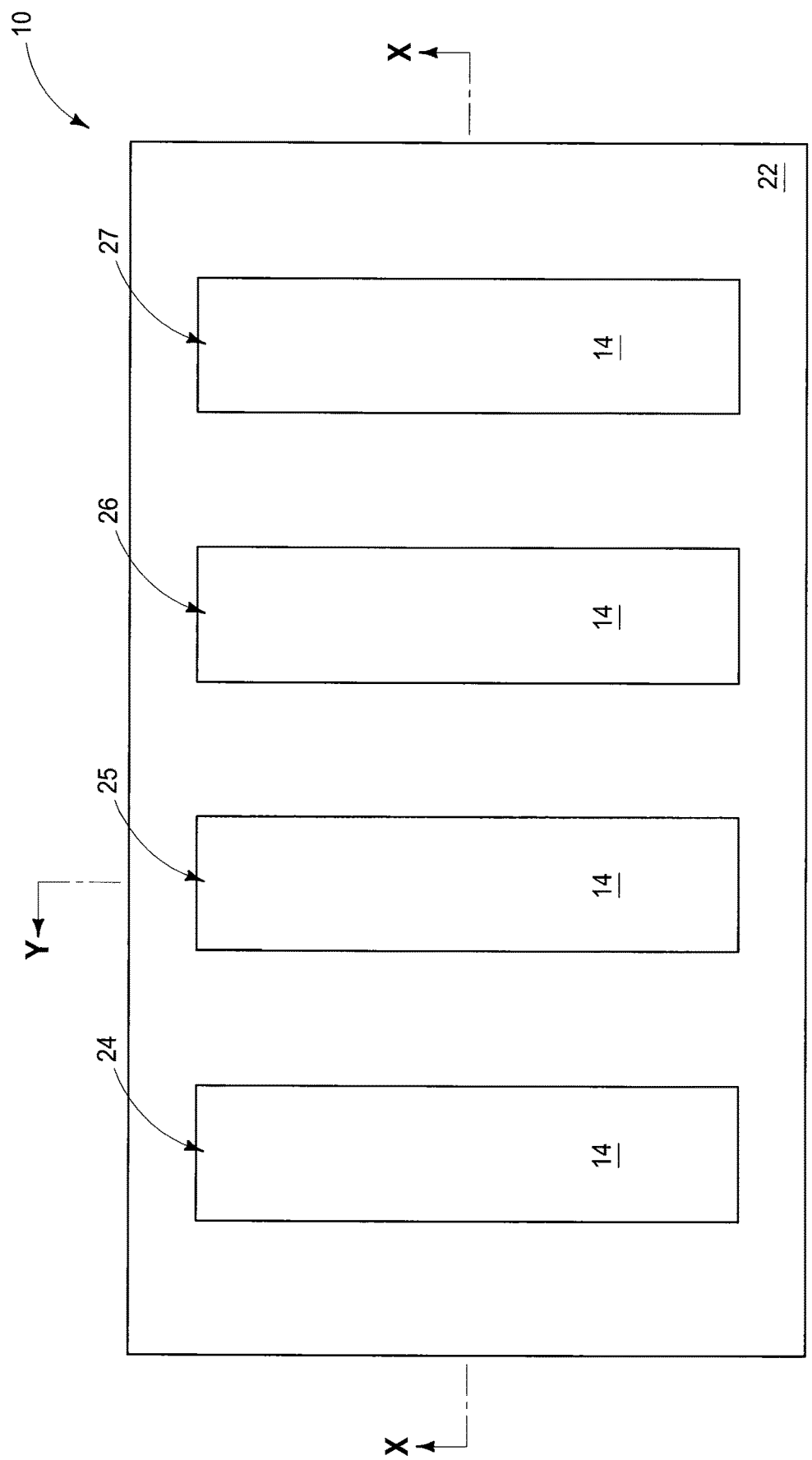
Figure 5:
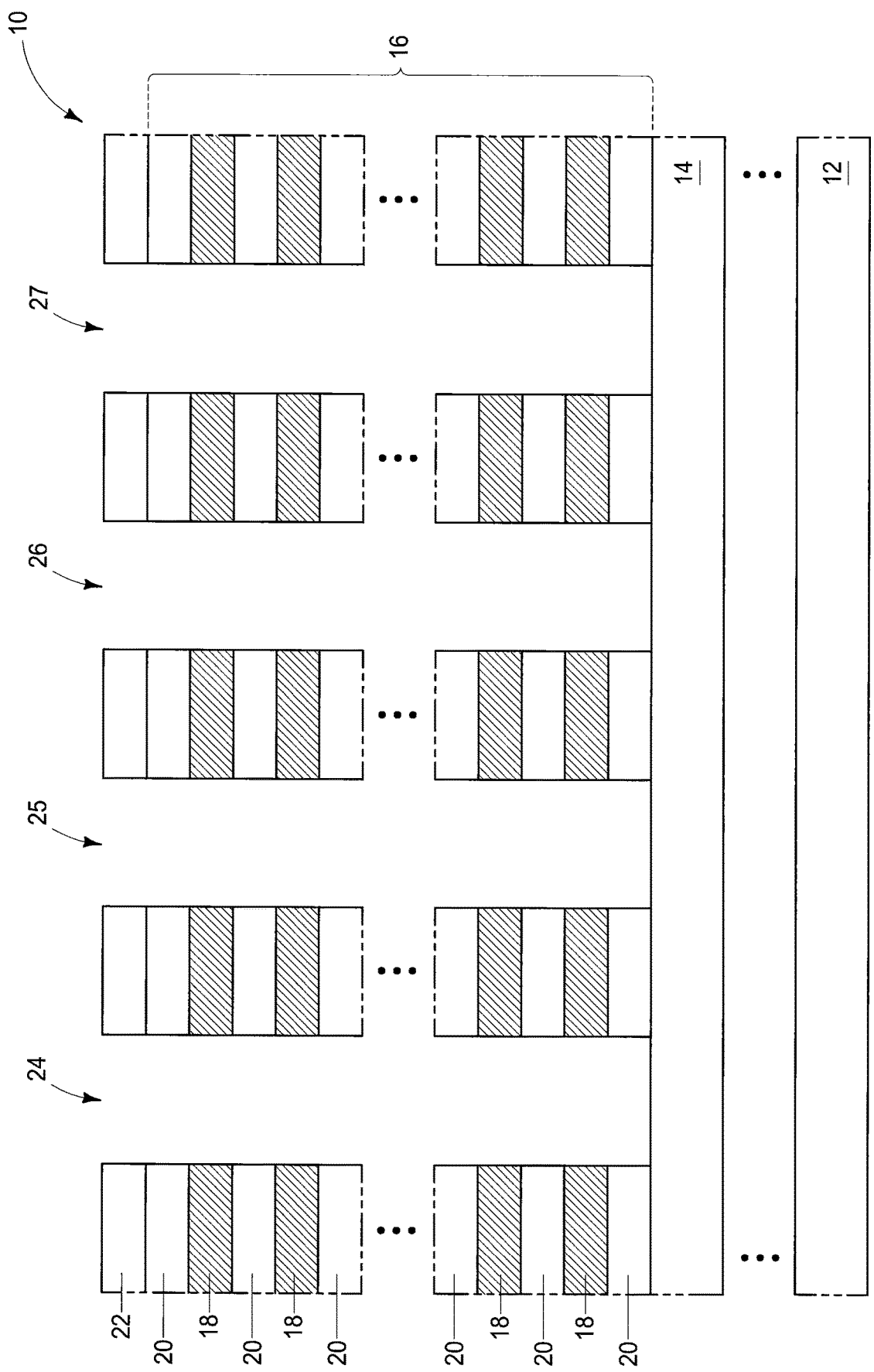
Figure 6:
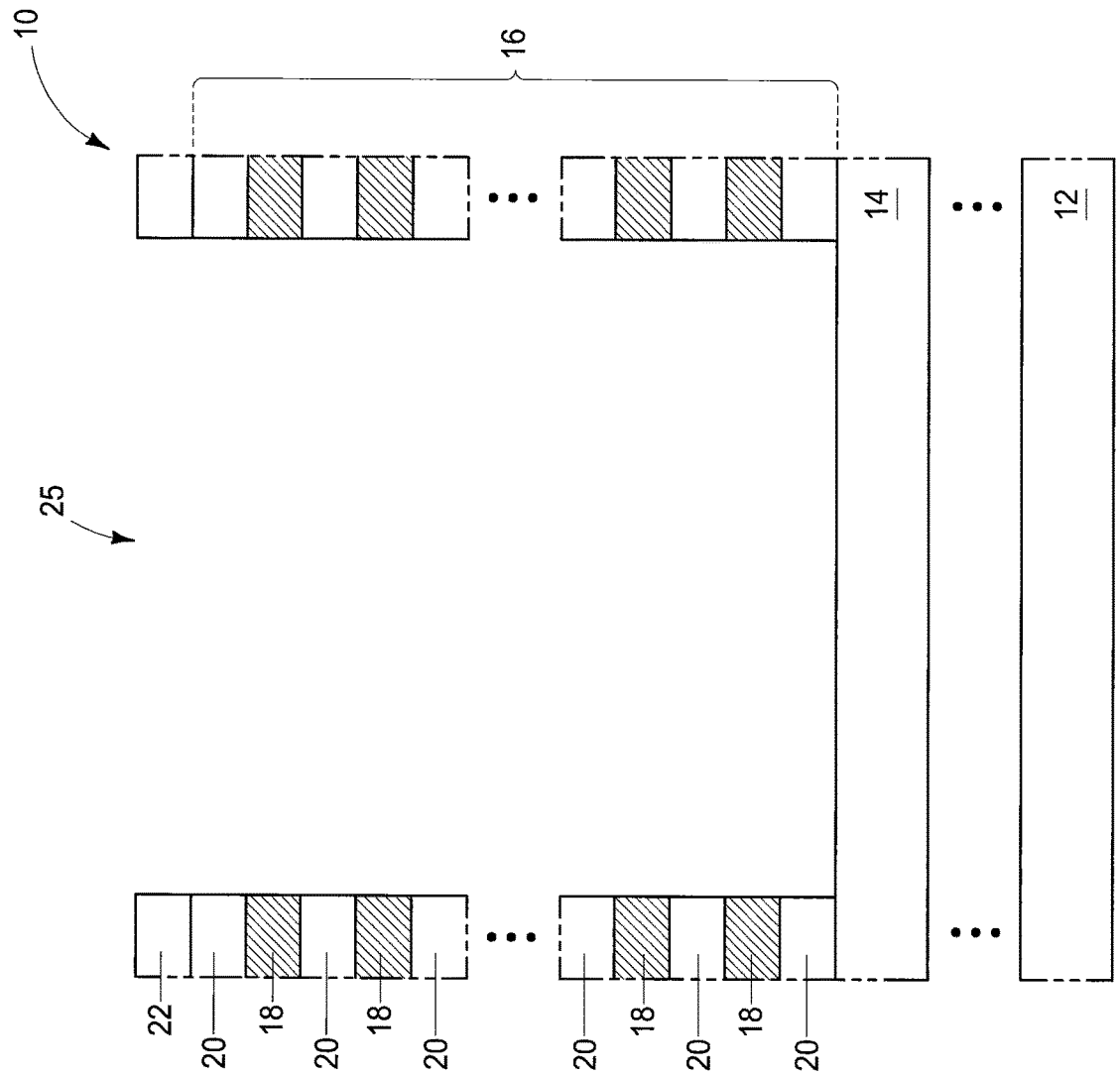

Referring to FIGS. 4-6, trenches 24-27 are formed to extend through the stack 16 to the etchstop material 14. The trenches may be formed with any suitable processing. For instance, in some embodiments a patterned masking material (not shown) may be formed over the hardmask material 22 to define locations of the trenches 24-27, a pattern from the masking material may be transferred into hardmask material 22 with one or more suitable etches, and then the pattern may be transferred from the hardmask material into stack 16 with one or more suitable etches. The patterned masking material may be removed at some point subsequent to the patterning of hardmask material 22. The masking material may comprise any suitable composition, and in some embodiments may comprise a photolithographically-patterned photoresist mask and/or a mask formed utilizing pitch-multiplication methodologies. In some embodiments, other materials (not shown) may be provided between a patterned masking material and the hardmask material 22. For instance, if the masking material comprises photolithographically-patterned photoresist, an antireflective material (not shown) and a carbon-containing material (not shown) may be provided between the hardmask material 22 and the photoresist. Such materials may be removed during or after formation of the trenches within stack 16 to leave the construction shown in FIGS. 4-6.

In the shown embodiment of FIGS. 4-6, trenches 24-27 are linear trenches which are substantially parallel to one another. The term "substantially parallel" means that the trenches are parallel to within reasonable tolerances of fabrication and measurement. Although the linear trenches of FIGS. 4-6 are shown to be separate from one another, in other embodiments (such as, for example, an embodiment described below with reference to FIGS. 32-35) a single serpentining trench may be formed which encompasses linear regions at the locations of trenches 24-27.

Figure 7:
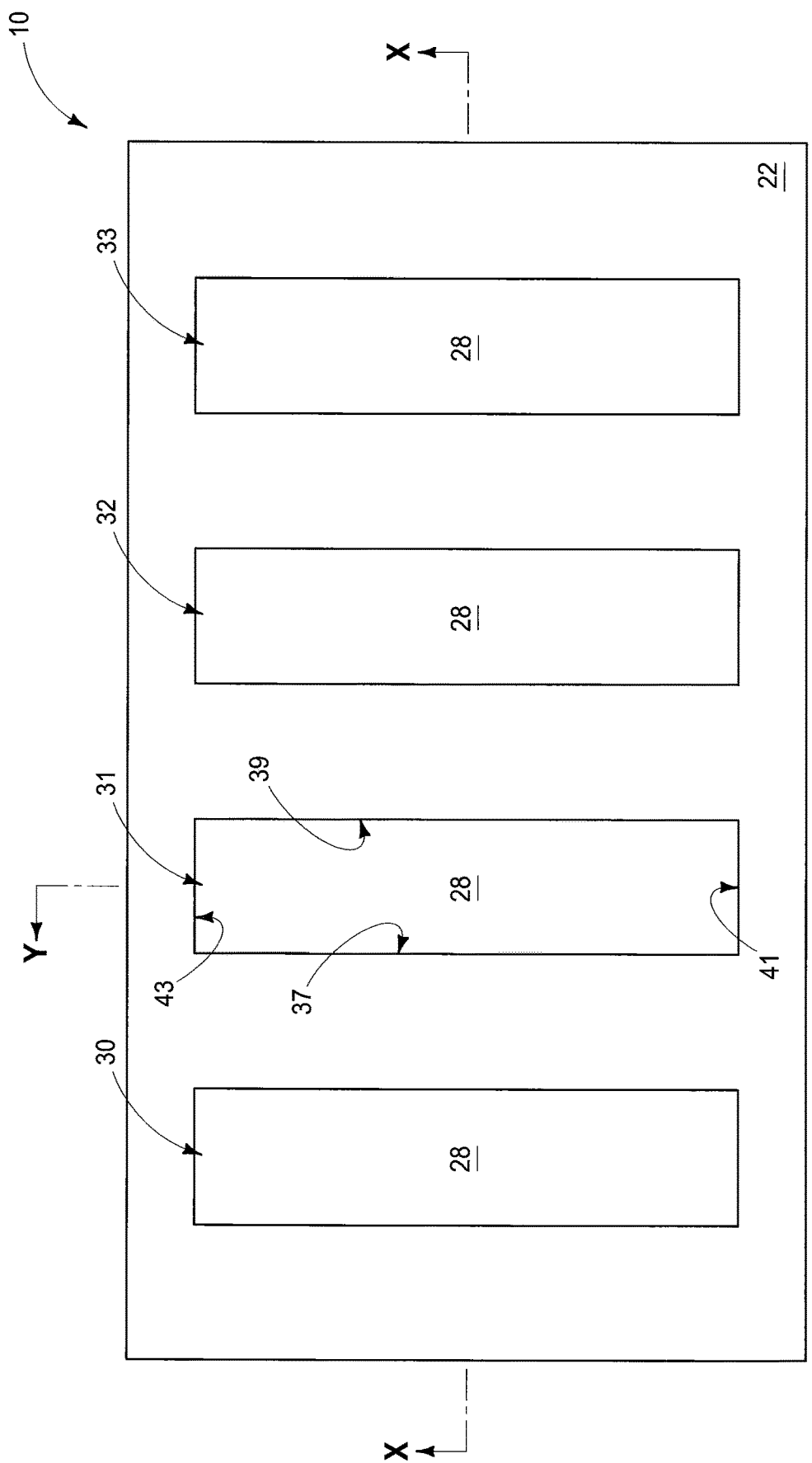
Figure 8:
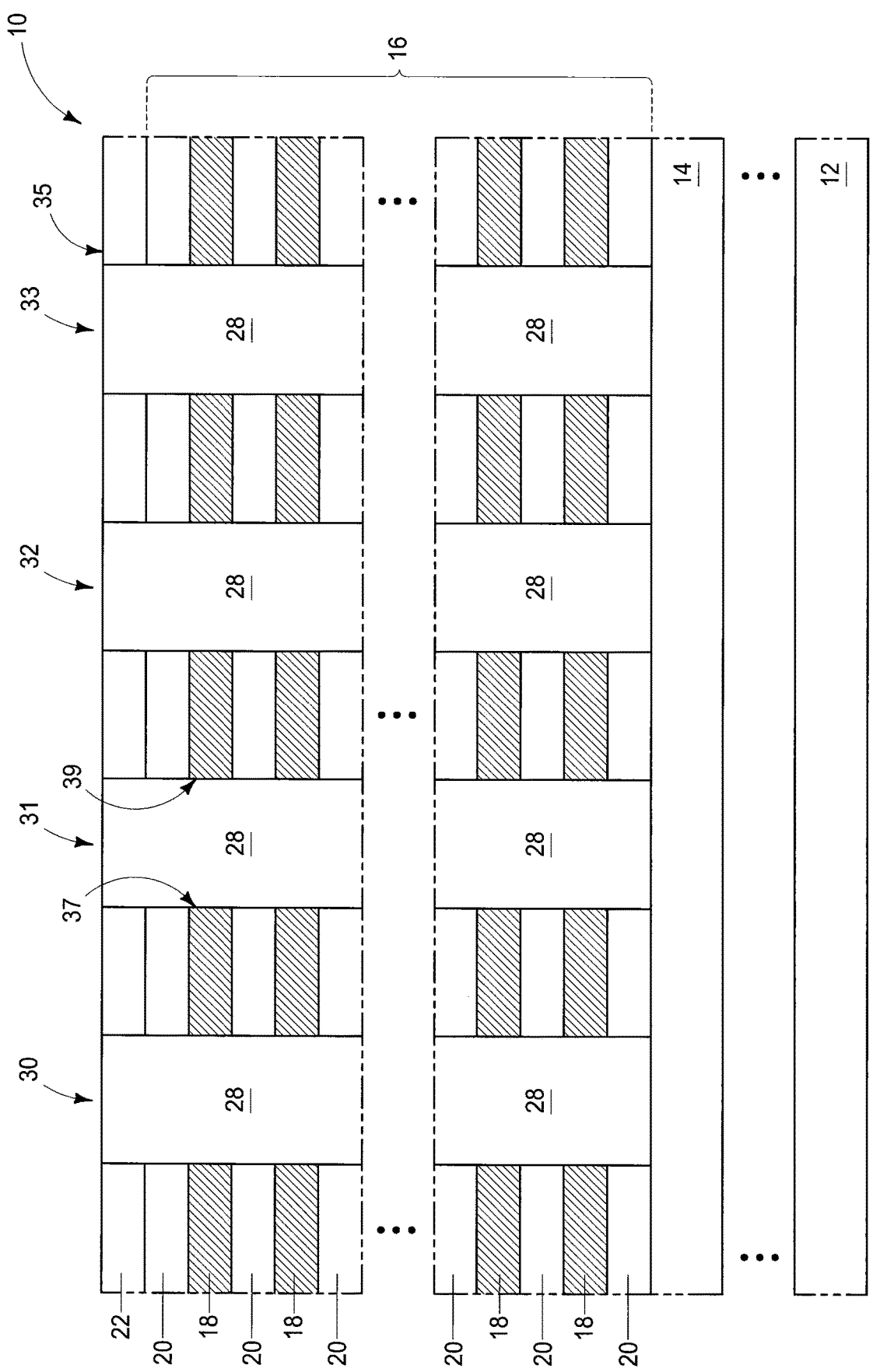
Figure 9:
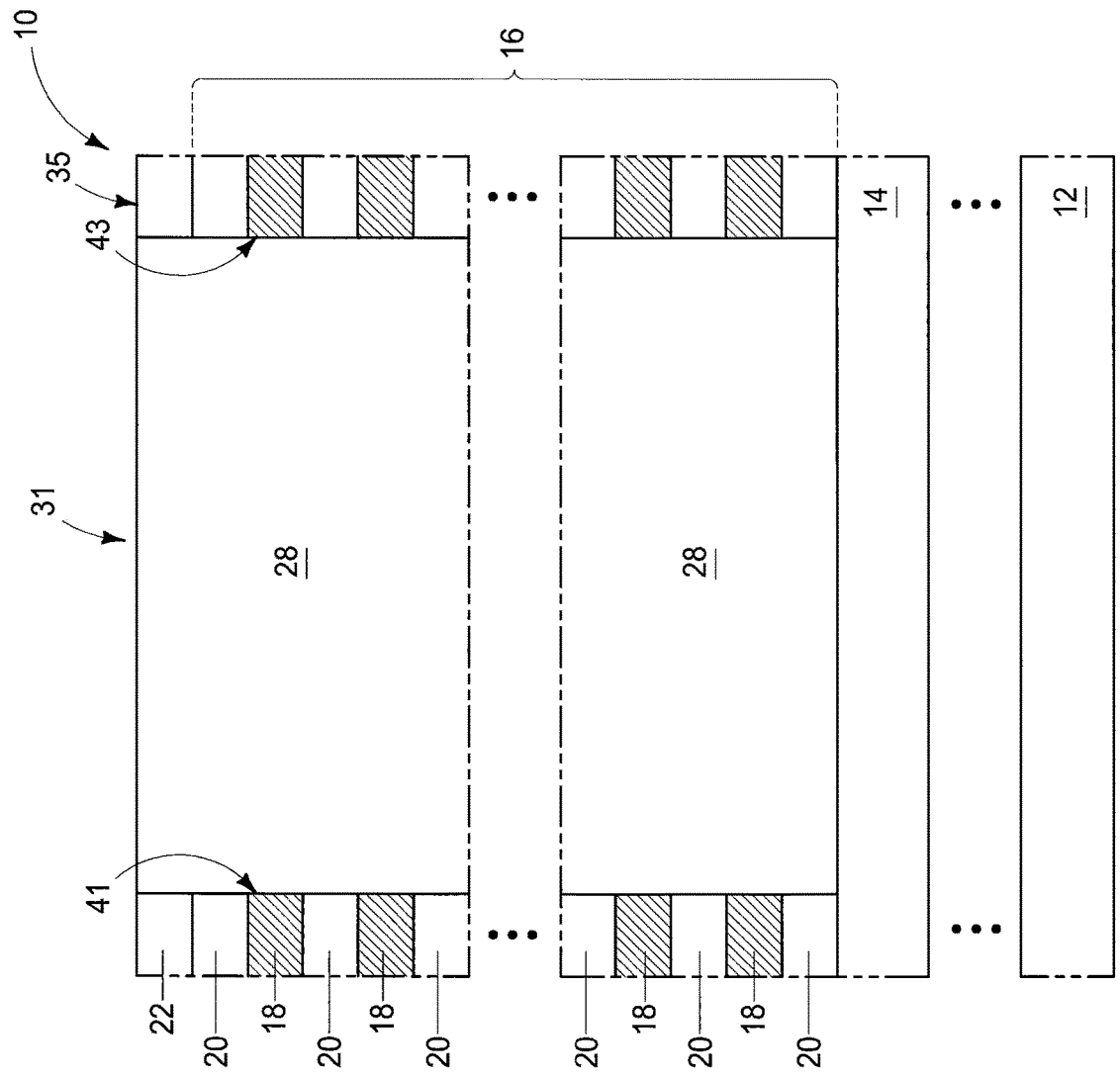

Referring to FIGS. 7-9, electrically insulative fill material 28 is provided within trenches 24-27 (FIGS. 4-6) to form electrically insulative panels 30-33 within such trenches. The fill material may comprise any suitable composition or combination of compositions; and in some embodiments may comprise, consist essentially of, or consist of an electrical insulative oxide, such as, for example, silicon dioxide. The fill material may be formed by any suitable processing, including, for example, atomic layer deposition (ALD), chemical vapor deposition (CVD), and/or physical vapor deposition (PVD). In the shown embodiment, a planarized surface 35 extends across fill material 28 and hardmask 22. Such planarized surface may be formed by any suitable processing. For instance, in some embodiments the fill material 28 may be formed to overfill the trenches 24-27 (FIGS. 4-6), and subsequently chemical-mechanical polishing (CMP) may be utilized to form the planarized surface 35.

In the shown embodiment, the panels 30-33 are rectangularly-shaped. Each panel has a pair of opposing sides 37 and 39 (shown relative to panel 31) which are adjacent to stack 16. The illustrated panels also have a pair of opposing ends 41 and 43 (shown relative to panel 31) which are also adjacent to the stack 16.

The panels 30-33 of FIGS. 7-9 are linear structures which are substantially parallel to one another. Although the panels of FIGS. 7-9 are shown to be separate from one another, in other embodiments (such as, for example, an embodiment described below with reference to FIGS. 32-35) a single serpentining panel may be formed which encompasses linear regions at the locations of panels 30-33.

Figure 10:
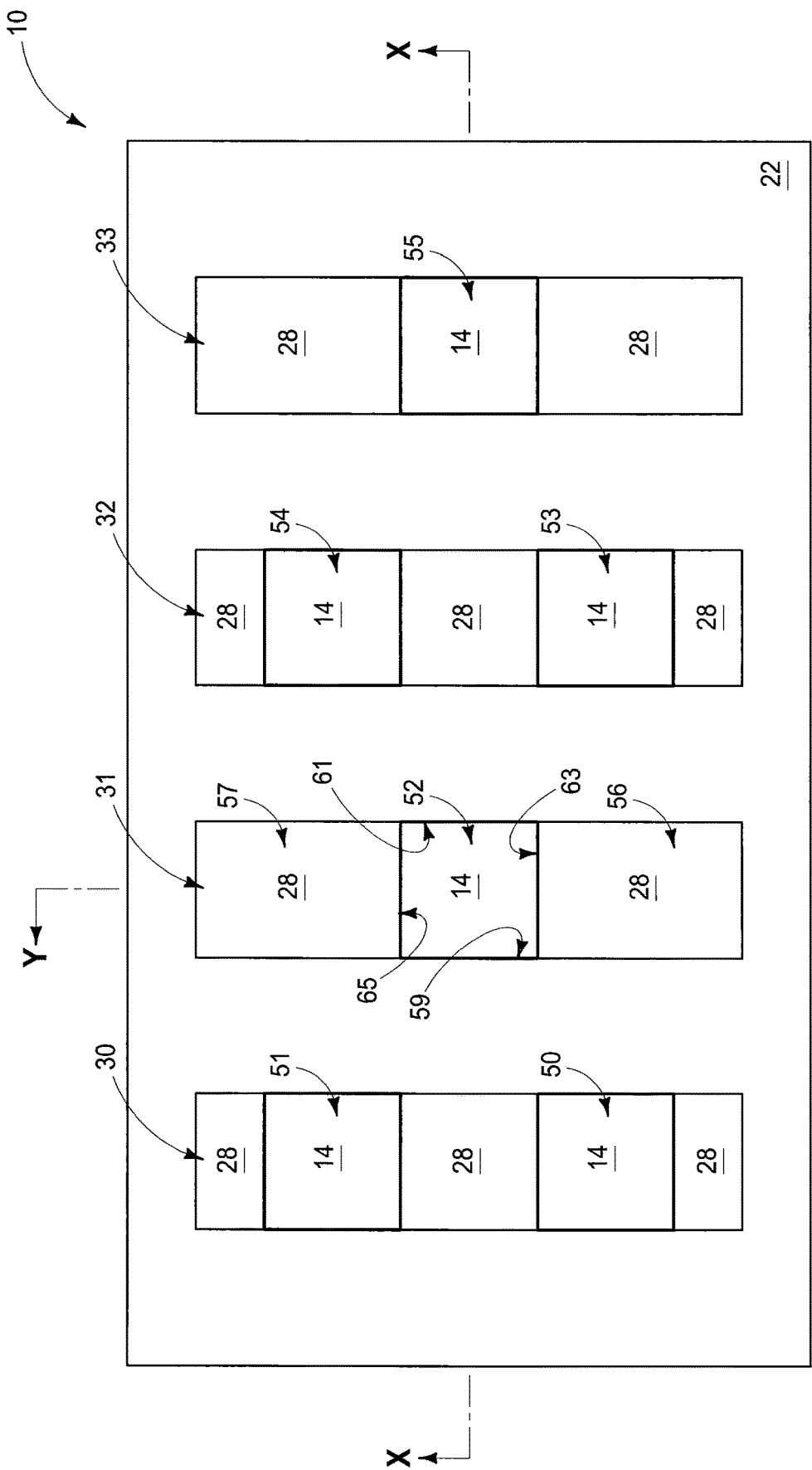
Figure 11:
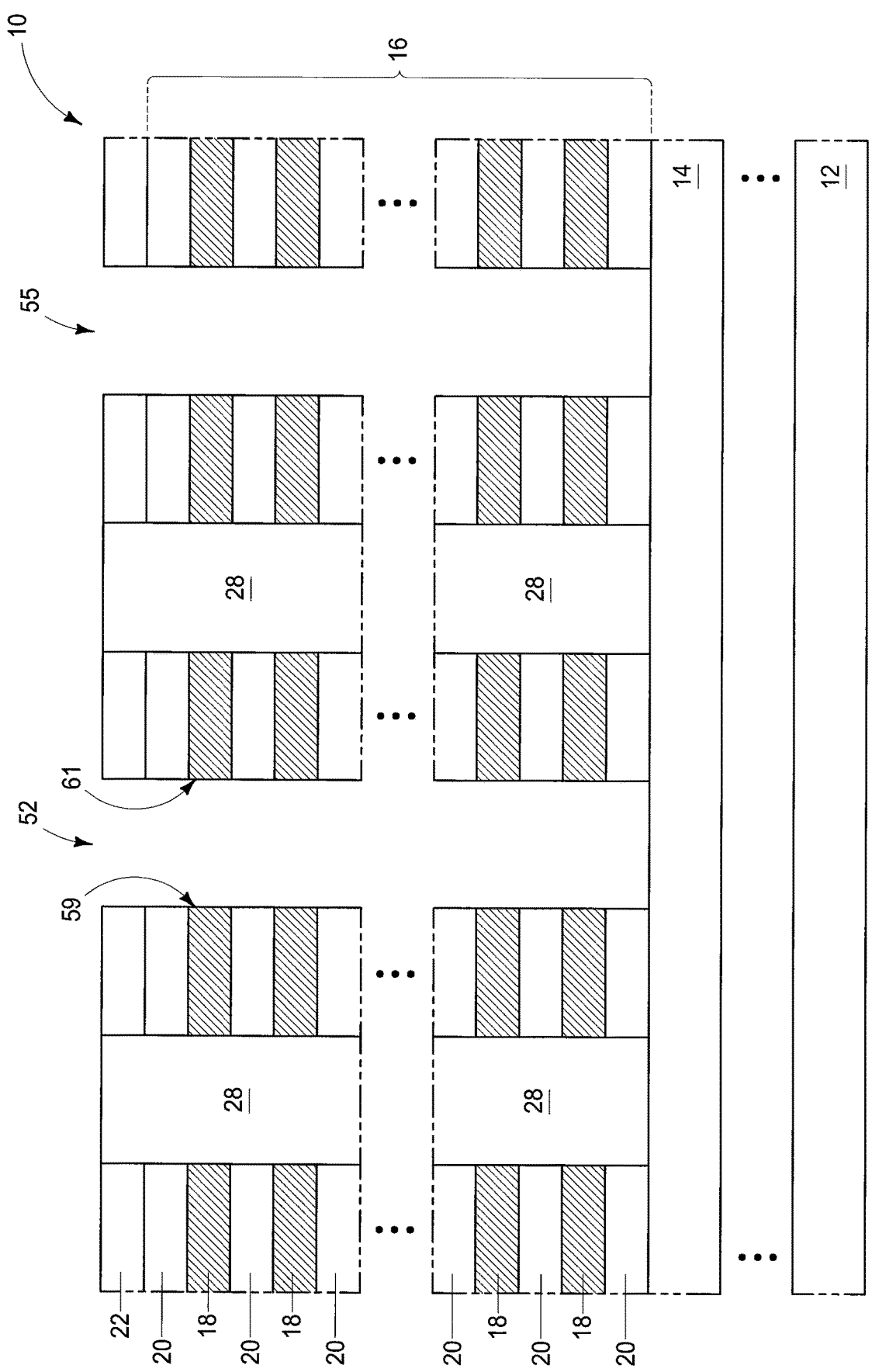
Figure 12:
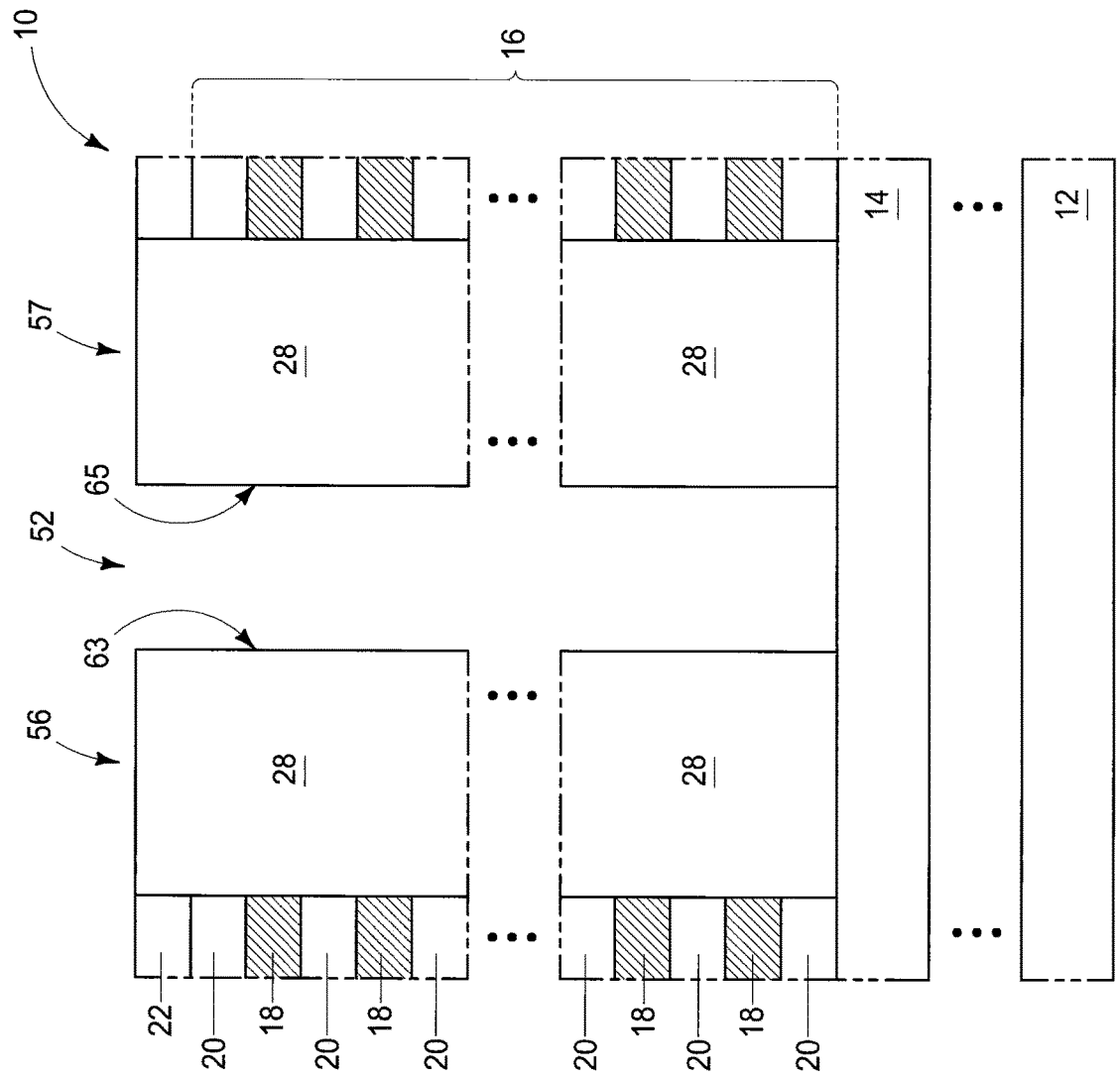

Referring to FIGS. 10-12, openings 50-55 are formed through panels 30-33. The openings may be formed utilizing any suitable processing. For instance, in some embodiments a patterned masking material (not shown) may be formed over the material 28 to define locations of the openings 50-55, and then a pattern may be transferred from the masking material into material 28 with one or more suitable etches. The patterned masking material may then be removed to leave the construction of FIGS. 10-12. The masking material may comprise any suitable composition, and in some embodiments may comprise a photolithographically-patterned photoresist mask and/or a mask formed utilizing pitch-multiplication methodologies. In some embodiments, other materials (not shown) may be provided between a patterned masking material and the material 28. For instance, if the masking material comprises photolithographically-patterned photoresist, an antireflective material (not shown) and a carbon-containing material (not shown) may be provided between the photoresist and the material 28. Such antireflective material and/or carbon-containing material may be removed during or after formation of the openings 50-55 to leave the construction shown in FIGS. 10-12.

The formation of openings 50-55 may be considered to result from the removal of some sections of panels 30-33. Other sections of the panels remain. For example, panel 31 is shown to comprise sections 56 and 57 remaining on opposing sides of opening 52. In some embodiments, each of the openings 50-55 may be considered to have a first pair of opposing sides along stack 16, and a second pair of opposing sides along remaining sections of the panels 30-33. For instance, opening 52 is shown to comprise a first pair of opposing sides 59 and 61 along stack 16, and to comprise a second pair of opposing sides 63 and 65 along the remaining sections 56 and 57 of panel 31.

The openings 50-55 may have any suitable shape. Although the openings are square in the top view of FIG. 10, in other embodiments the openings may have other shapes. For instance, in some embodiments the openings may be circular or elliptical when viewed in a top view analogous to that of FIG. 10.

In the shown embodiment, the sidewalls of openings 50-55 are substantially vertical. In actual processing, such sidewalls may be tapered.

The openings may be formed to extend to the etch stop material 14 (as shown), or may be formed to extend through such etch stop material in other embodiments.

Figure 13:
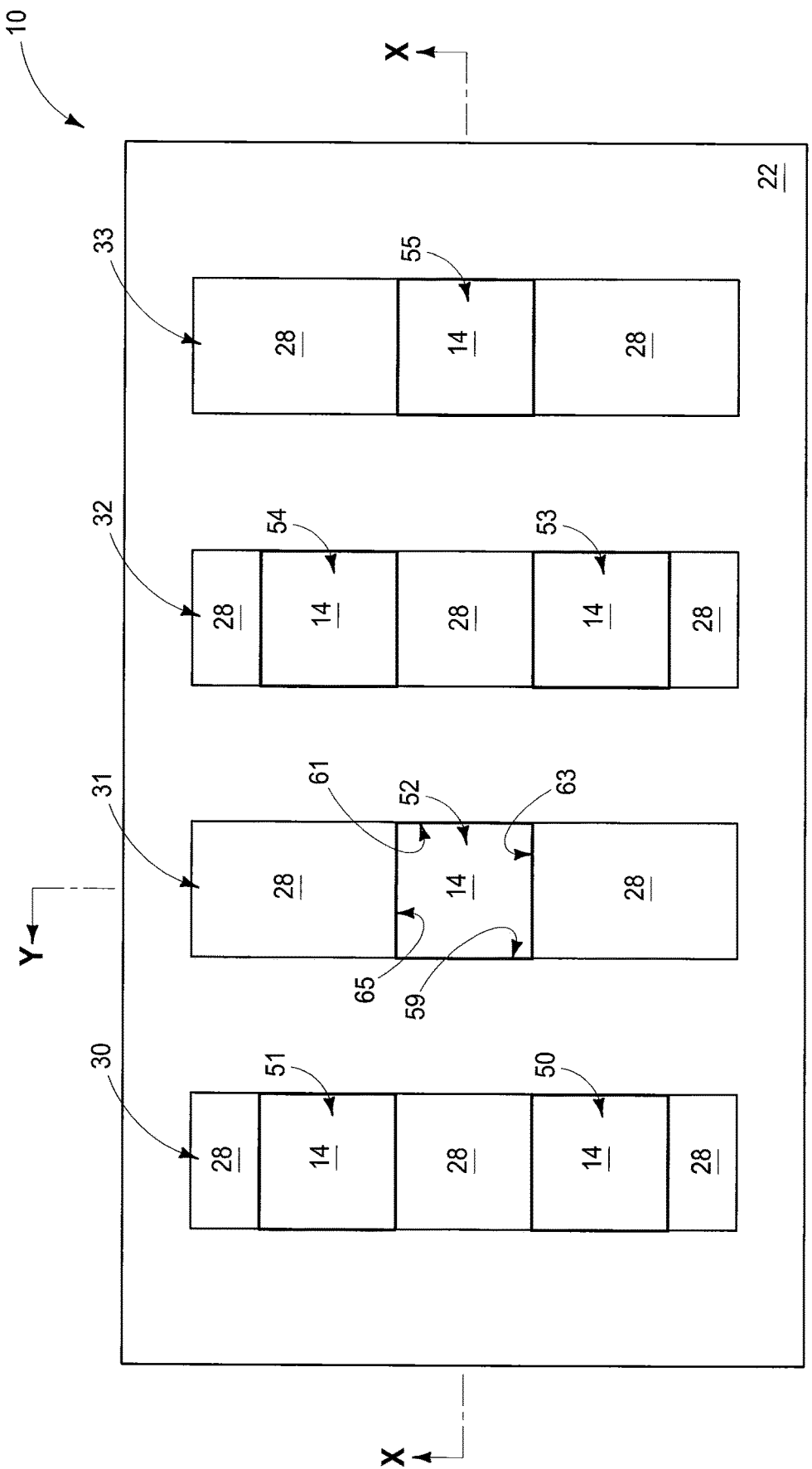
Figure 14:
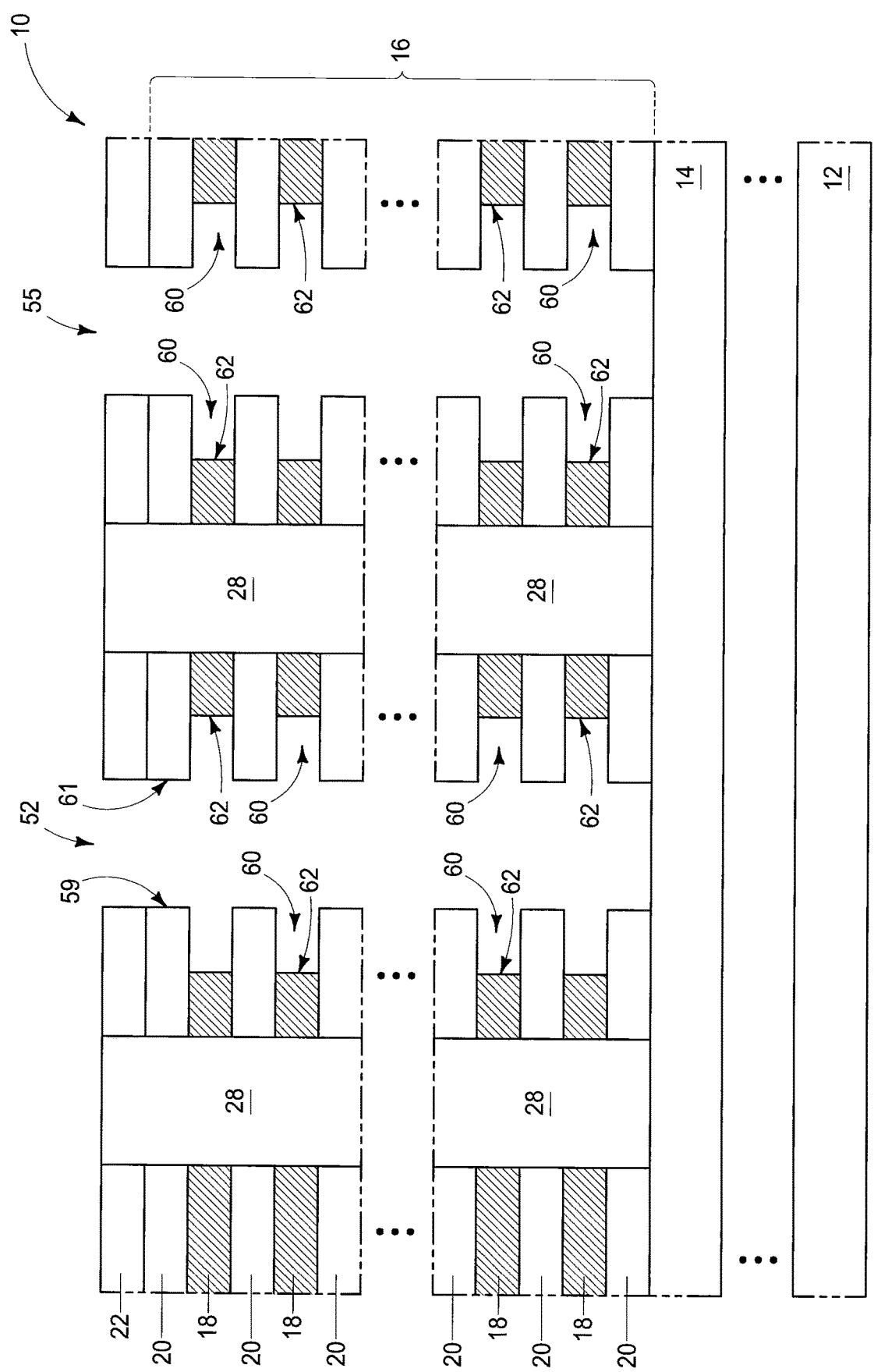
Figure 15:
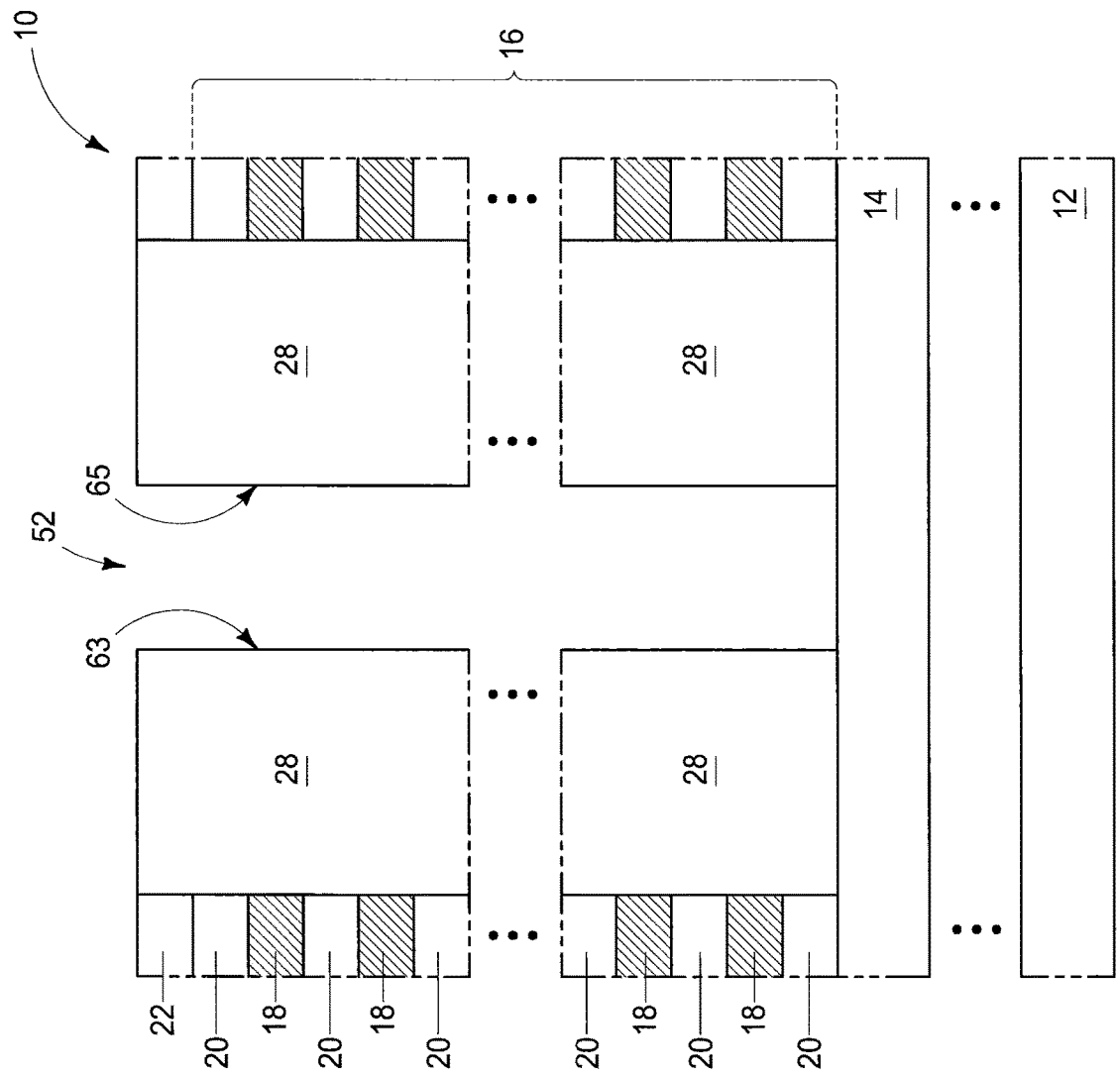

Referring to FIGS. 13-15, the electrically conductive levels 18 are etched along sidewalls of openings 50-55 to form cavities 60 (only some of which are labeled) extending into the conductive levels.

In some embodiments, the electrically conductive levels 18 comprise metal (for instance, tungsten), the electrically insulative levels 20 and electrically insulative material 28 comprise silicon dioxide, and the formation of cavities 60 utilizes isotropic etching which is substantially selective for the metal relative to the silicon dioxide.

The electrically conductive levels 18 have exposed edges 62 (only some of which are labeled) within the cavities 60.

Figure 16:
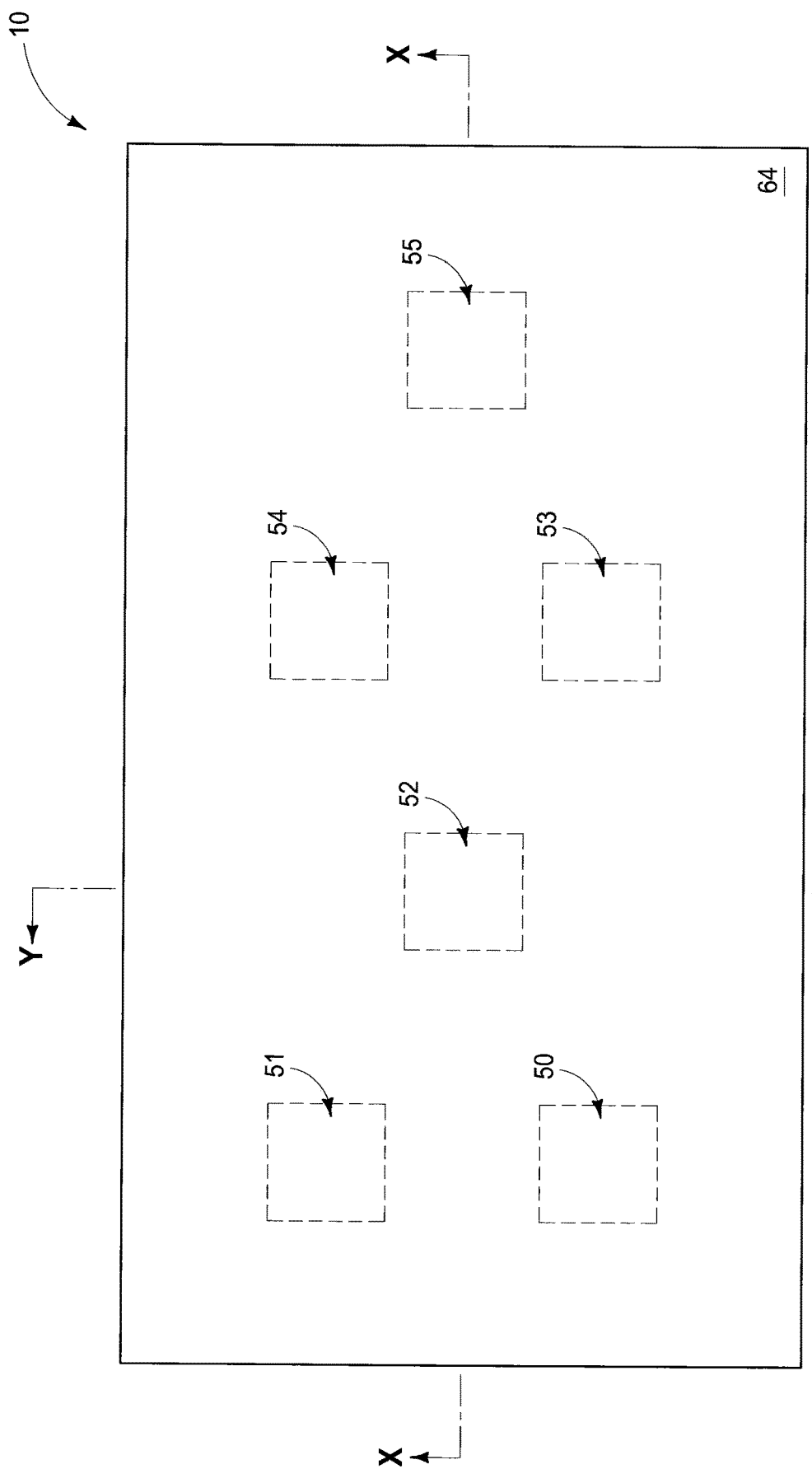
Figure 17:
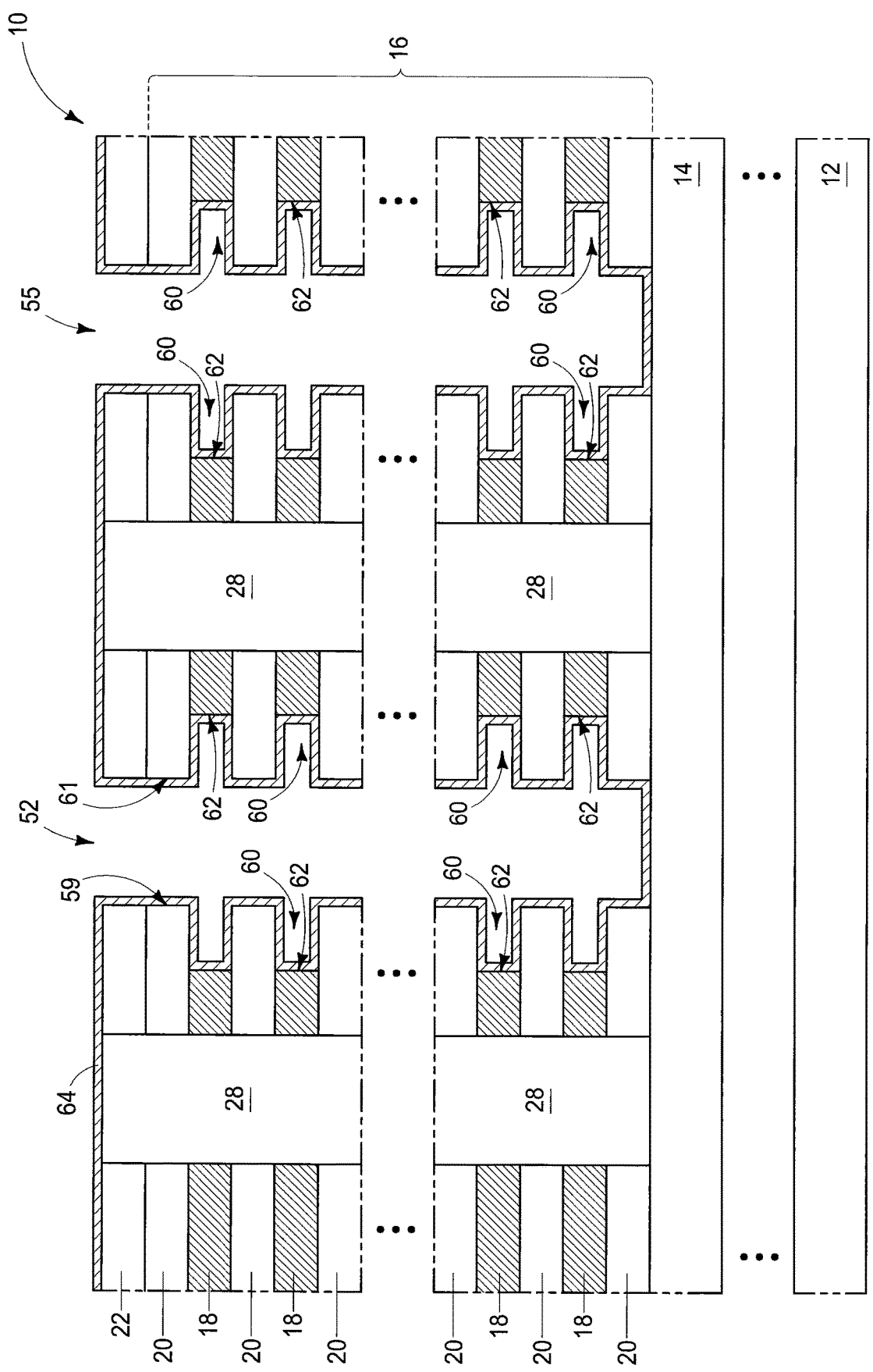
Figure 18:
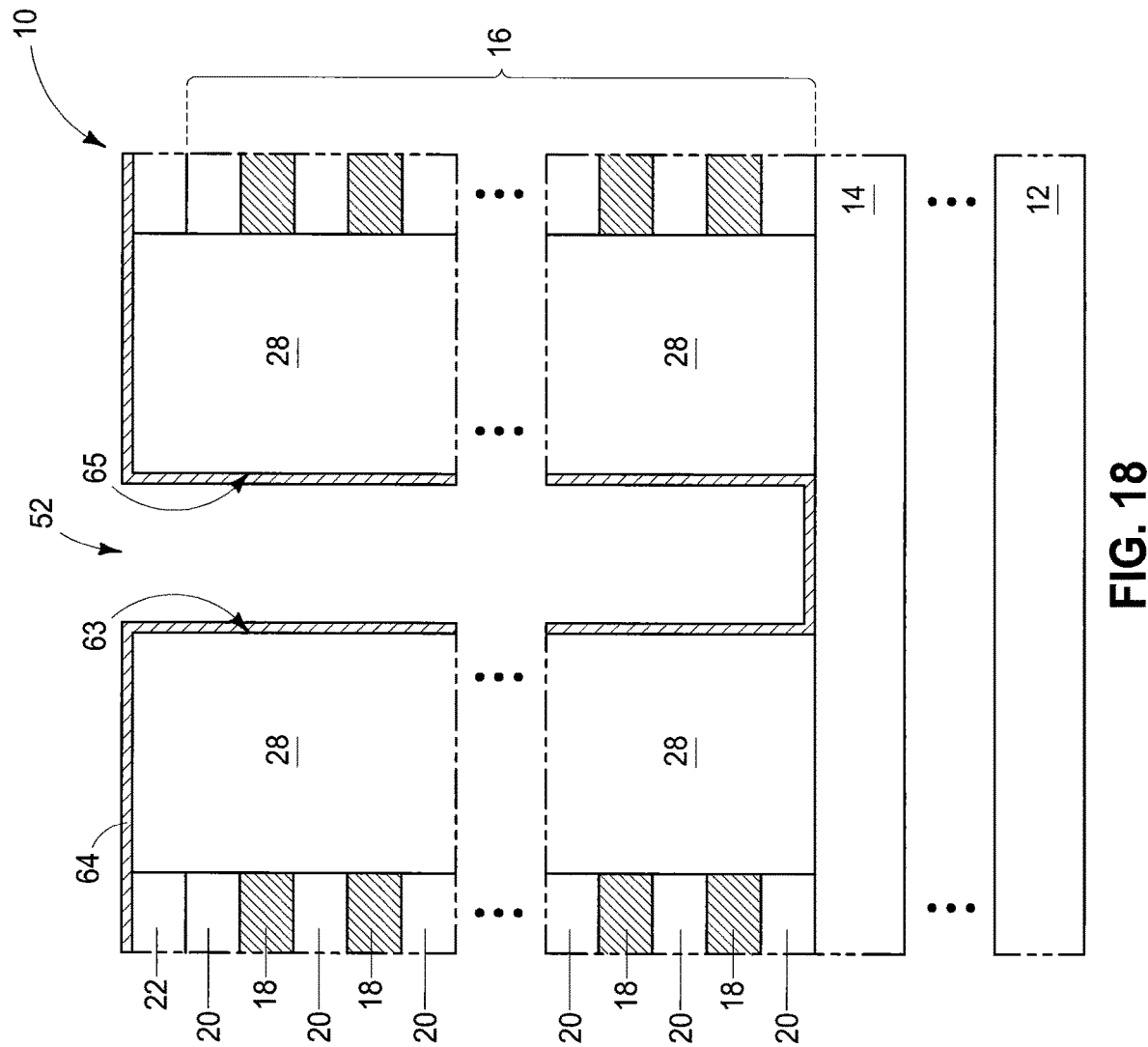

Referring to FIGS. 16-18, electrically conductive electrode material 64 is formed across upper surfaces of materials 22 and 28, and within cavities 60. The electrode material 64 may comprise any suitable composition; and in some embodiments may comprise, consist essentially of, or consist of one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, in some embodiments the electrode material 64 may comprise, consist essentially of, or consist of one or more of TiSiN, TiAlN, TiN, WN, Ti, C and W; where the formulas indicate the components within the listed compounds, rather than designating specific stoichiometries of such components.

The electrode material 64 may be referred to as first electrode material, or as bottom electrode material, in some embodiments.

Figure 19:
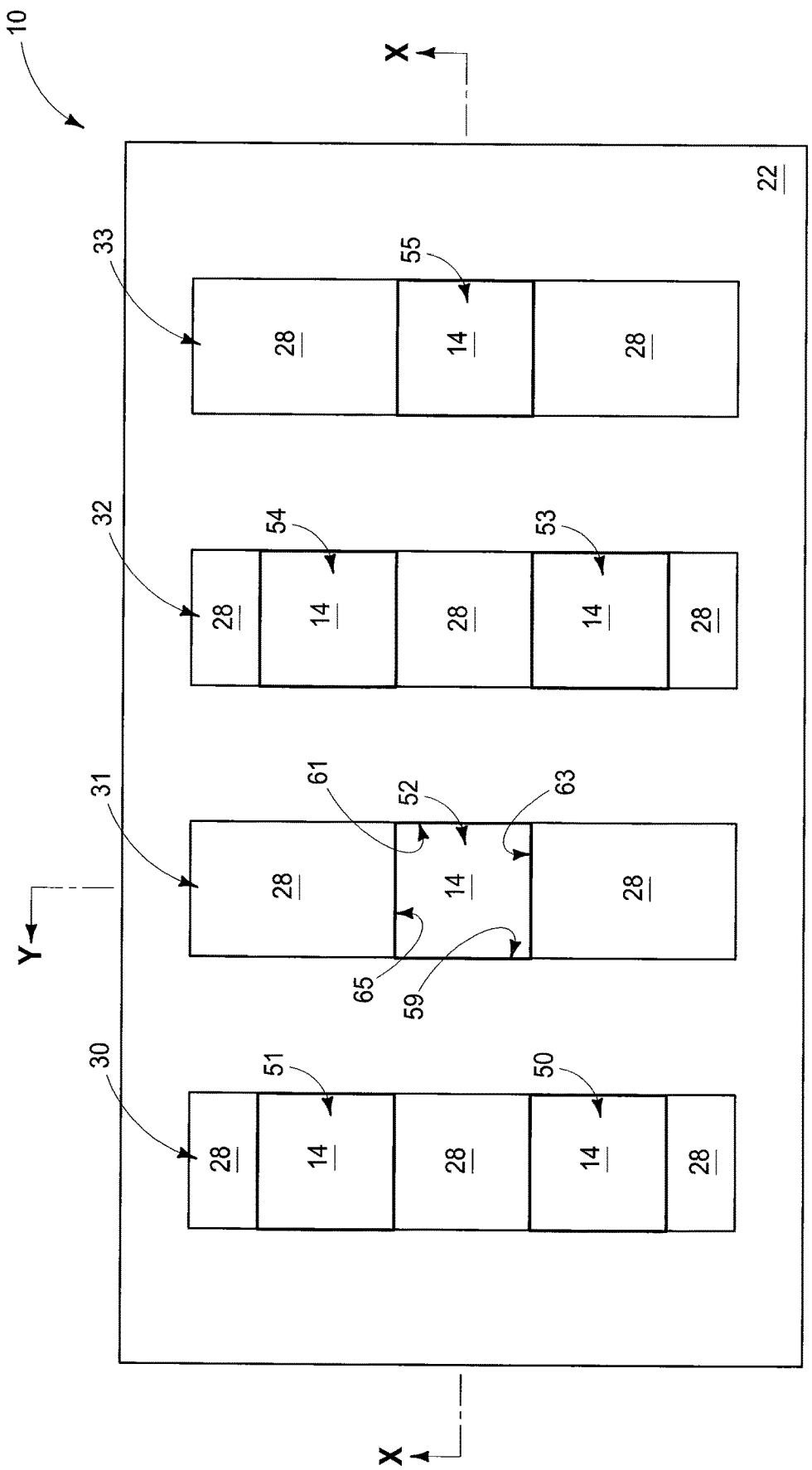
Figure 20:
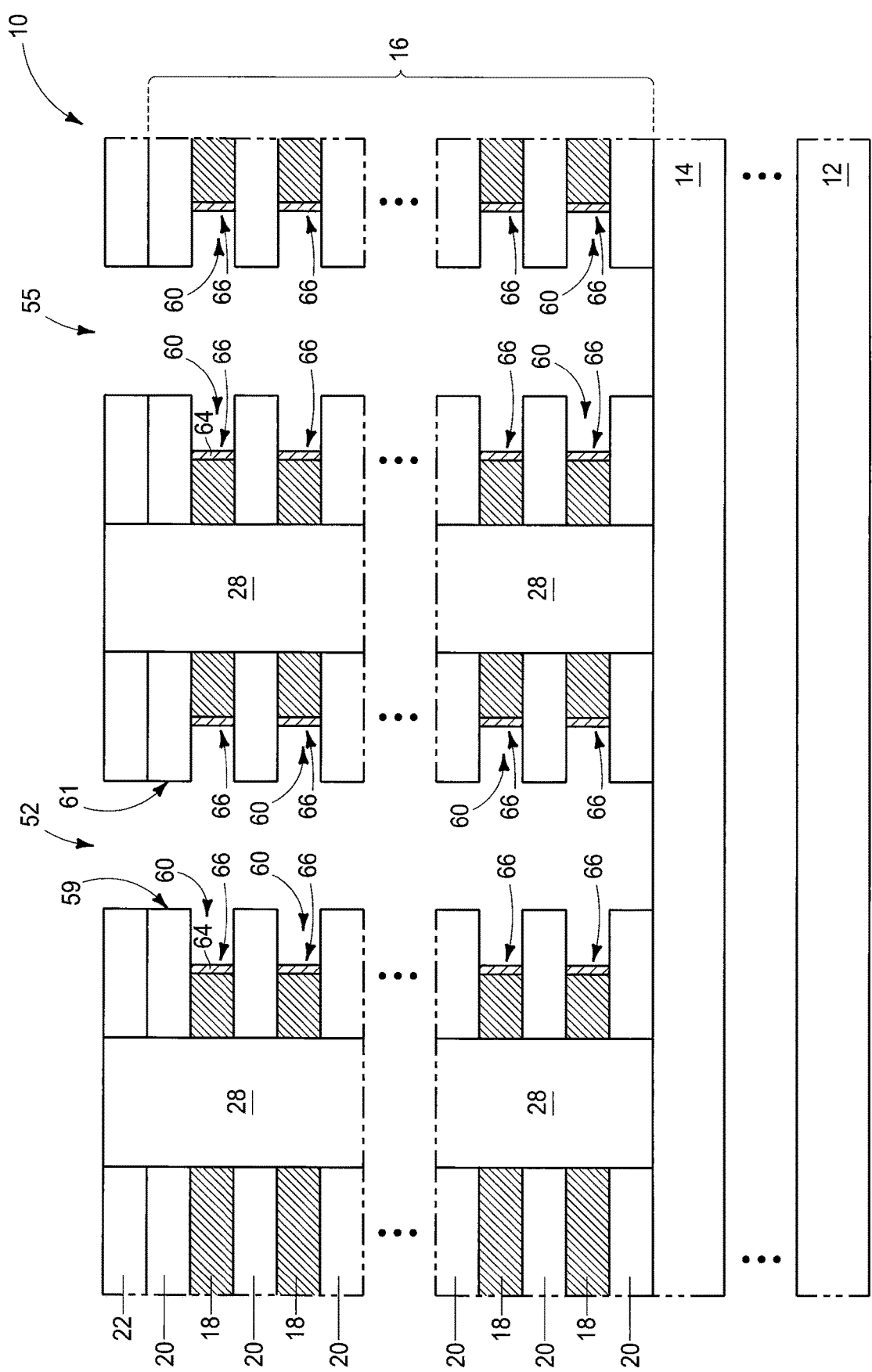
Figure 21:
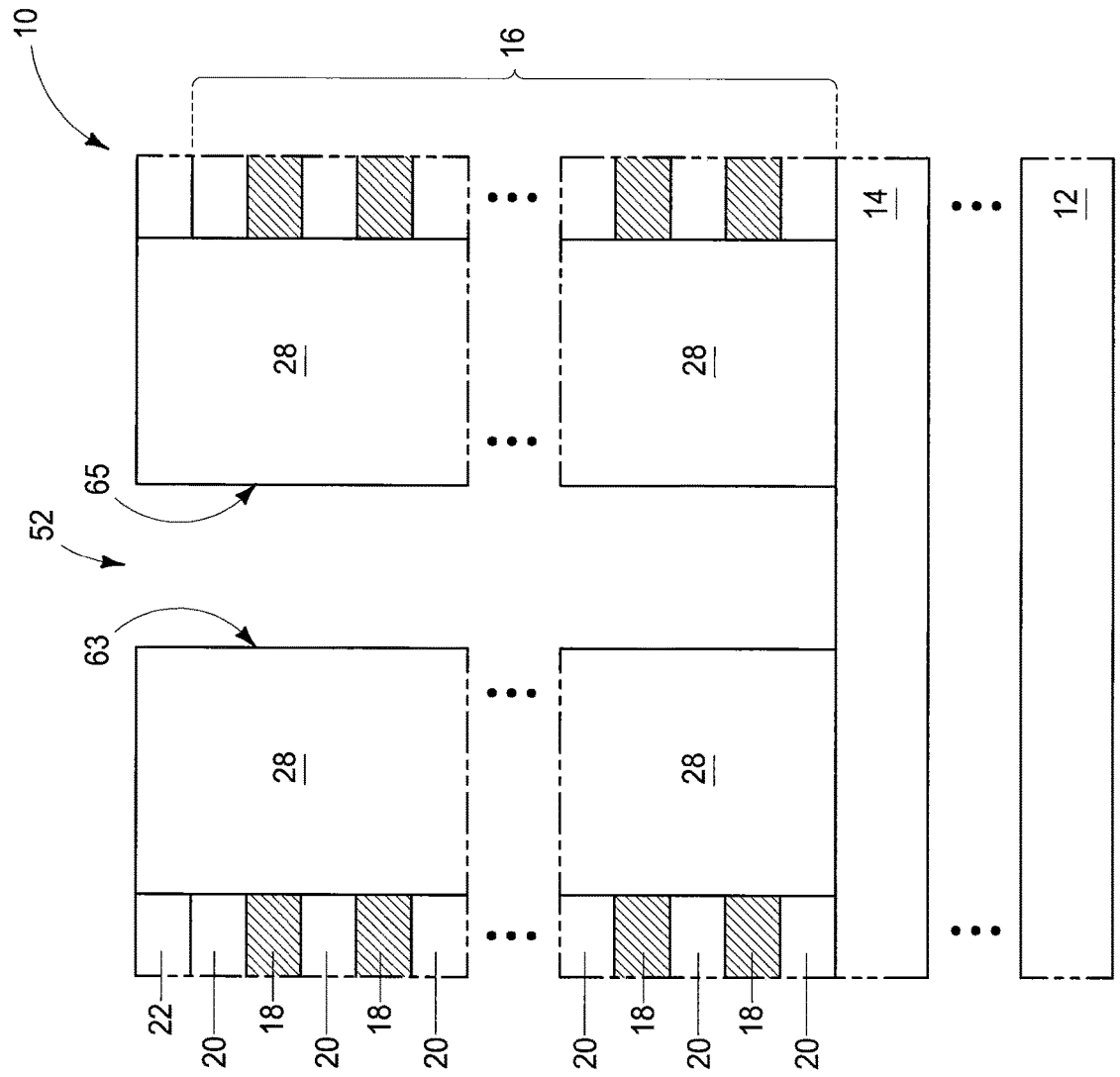

Referring to FIGS. 19-21, the electrode material 64 is etched back to remove all of the material 64 except for that which is within cavities 60 (only some of which are labeled) and along surfaces of conductive levels 18. The etching of material 64 may utilize any suitable processing, such as, for example, a timed isotropic etch. Such etching forms material 64 into a plurality of electrodes 66. The electrodes 66 may be referred to as either first electrodes or bottom electrodes in some embodiments.

Figure 22:
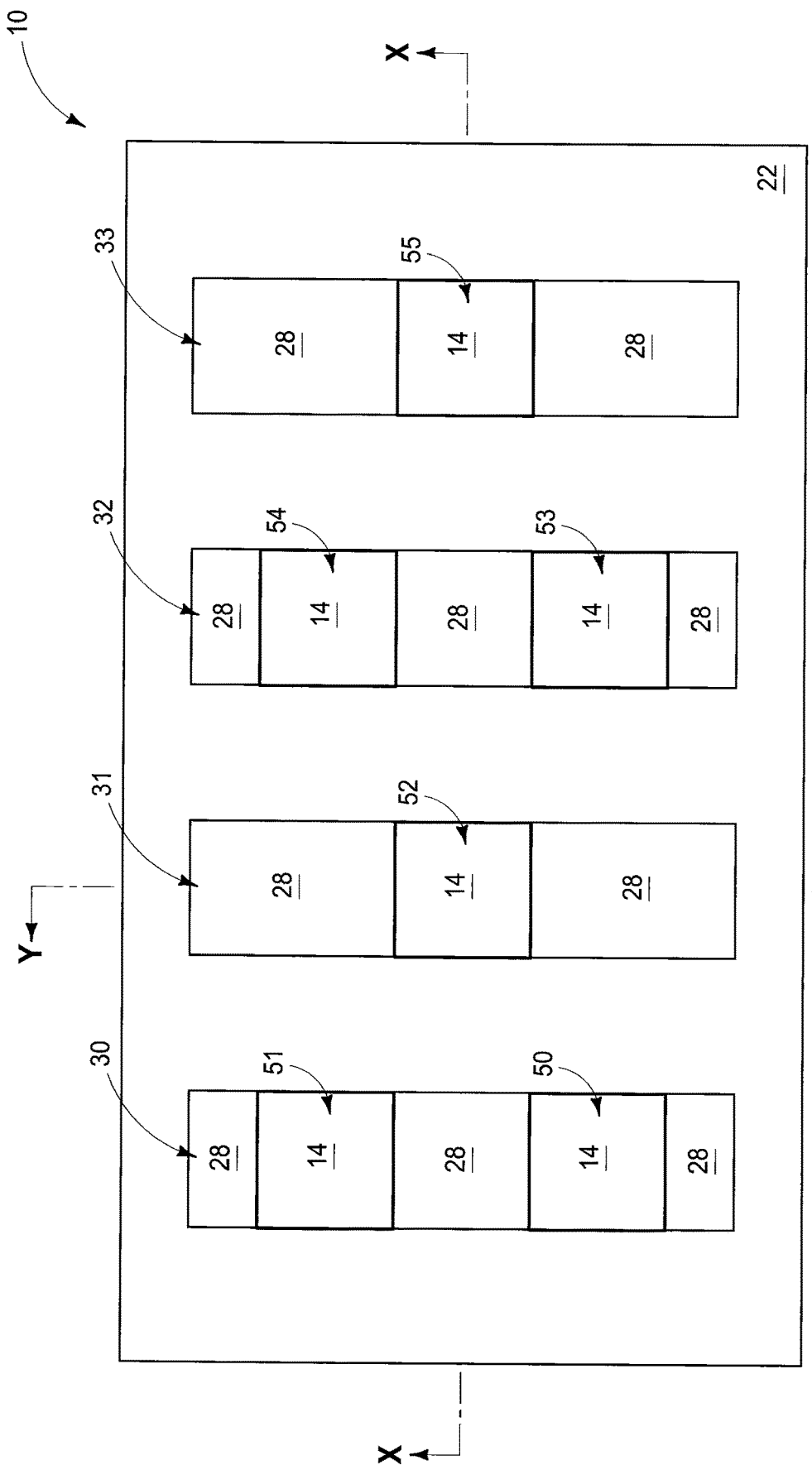
Figure 23:
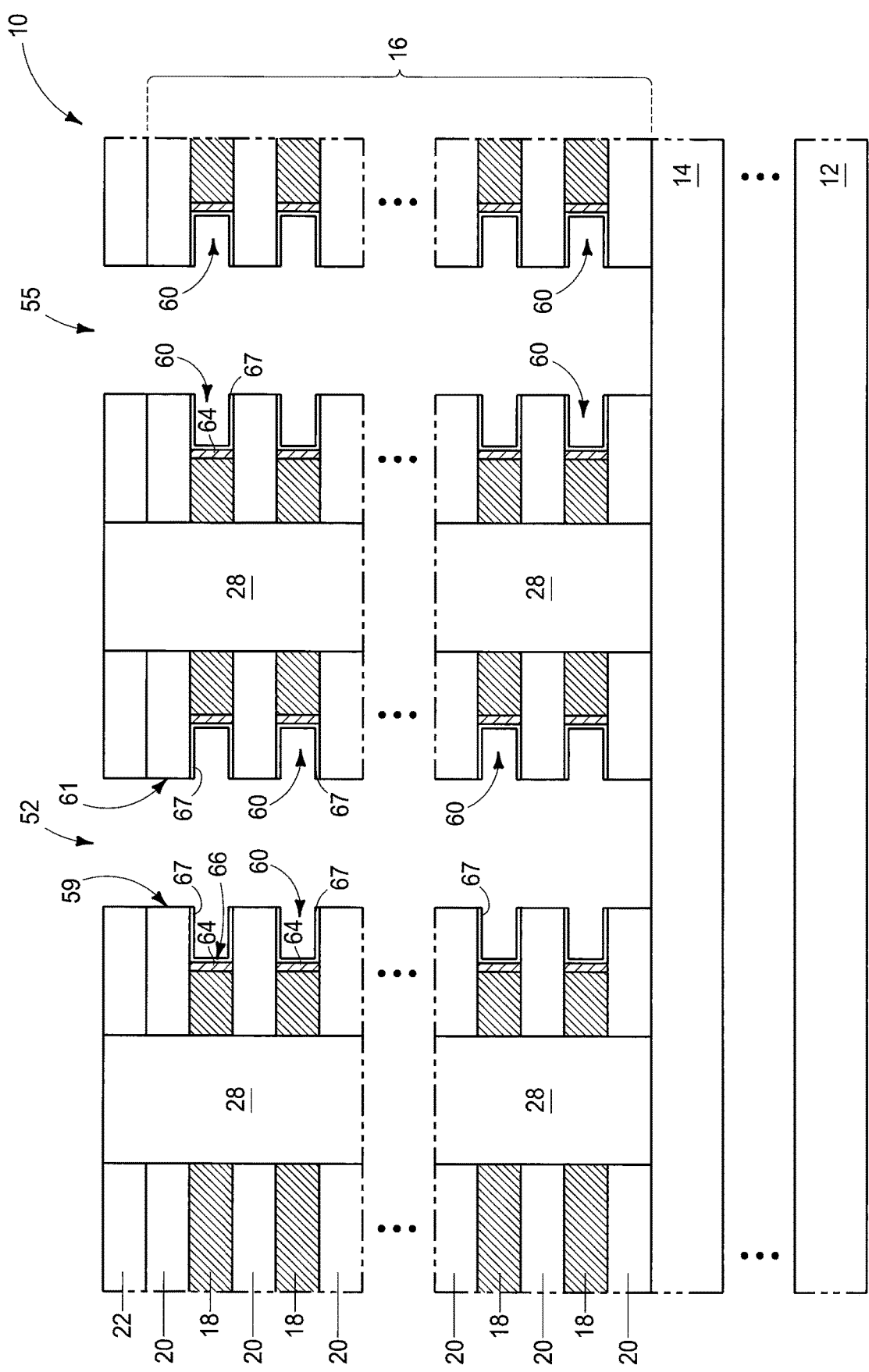
Figure 24:
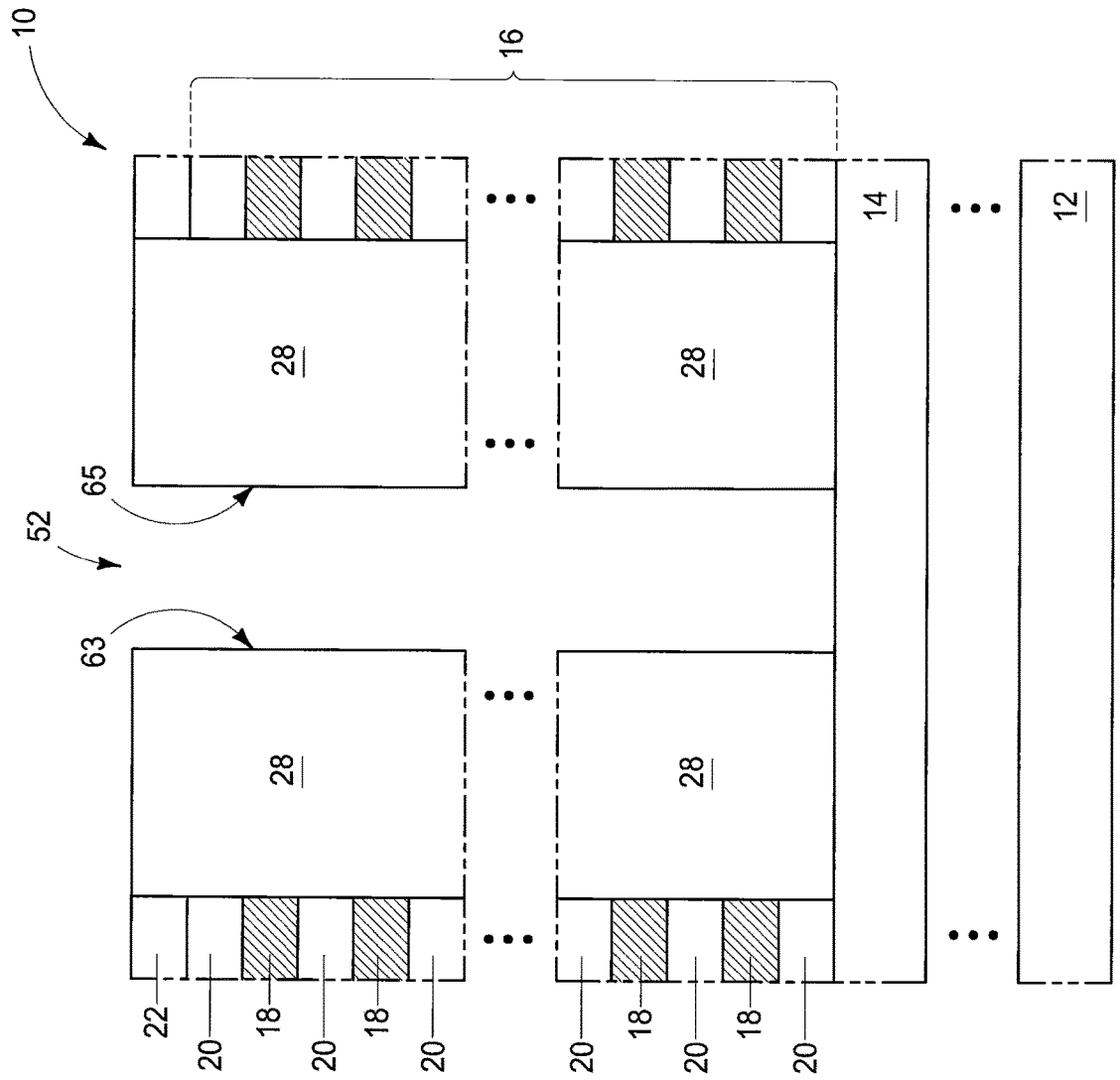

Referring to FIGS. 22-24, dielectric material 67 (only some of which is labeled) is formed within cavities 60 (only some of which are labeled). The material 67 lines the cavities, and thus forms electrically insulative liners within the cavities. Such liners may prevent shorting between electrodes 66 and other electrodes of PCM cells, as described below with reference to FIG. 31. The dielectric material may comprise any suitable material; such as, for example, silicon dioxide, aluminum oxide, silicon nitride, silicon oxynitride, hafnium oxide, etc. In some embodiments, the dielectric material 67 may be thin enough to avoid problematically interfering with cell performance, and yet thick enough to prevent undesired shorting between electrodes; and may, for example, have a thickness of from greater than 0 angstroms to less than or equal to about 20 angstroms; from greater than 0 angstroms to less than or equal to about 10 angstroms, etc. In some embodiments, the dielectric material 67 may be of appropriate composition to be incorporated into a cell select device (for instance, on ovonic threshold switch), or to be incorporated into phase change material; and in such embodiments the dielectric material may comprise, for example, oxide-containing ovonic material.

Figure 25:
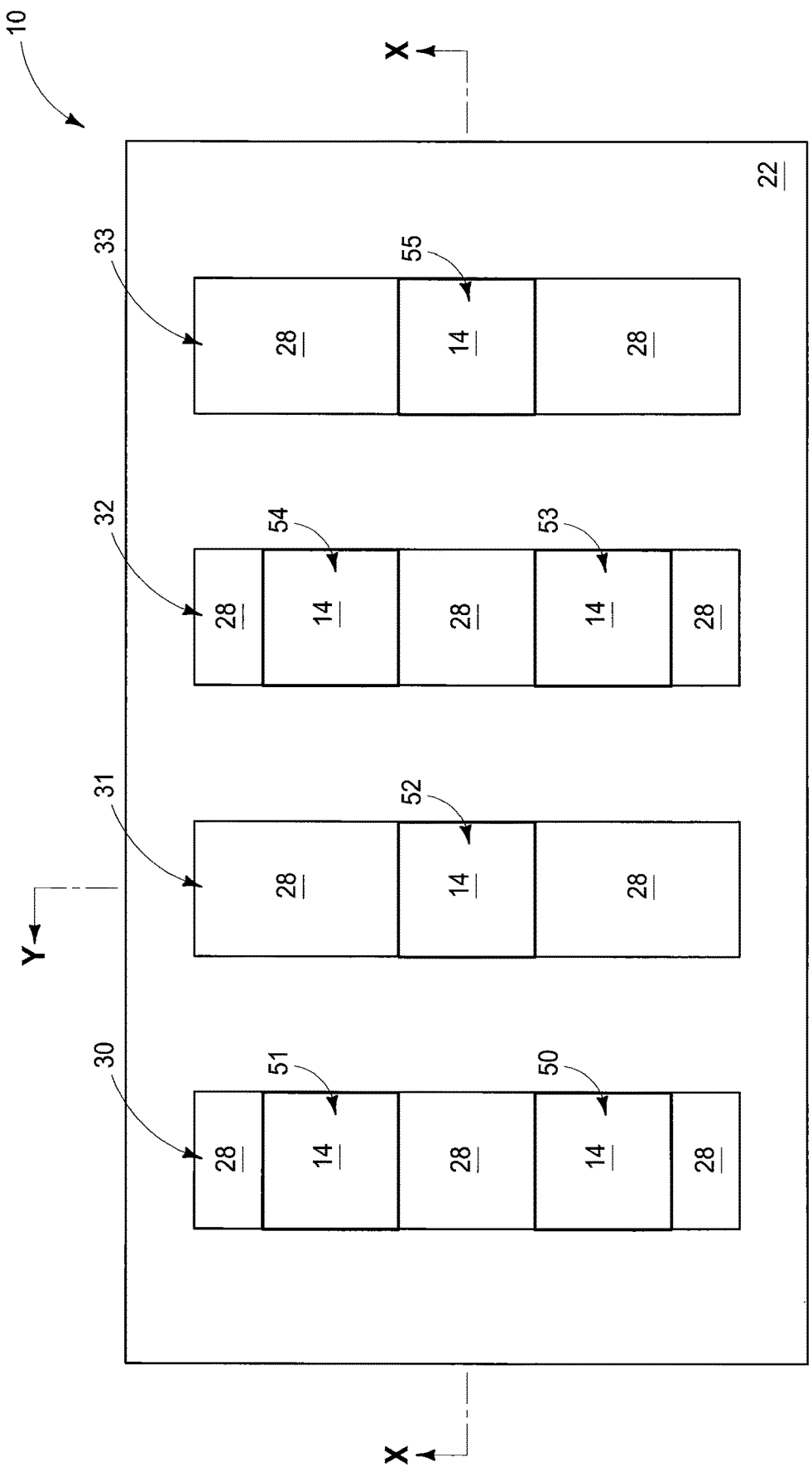
Figure 26:
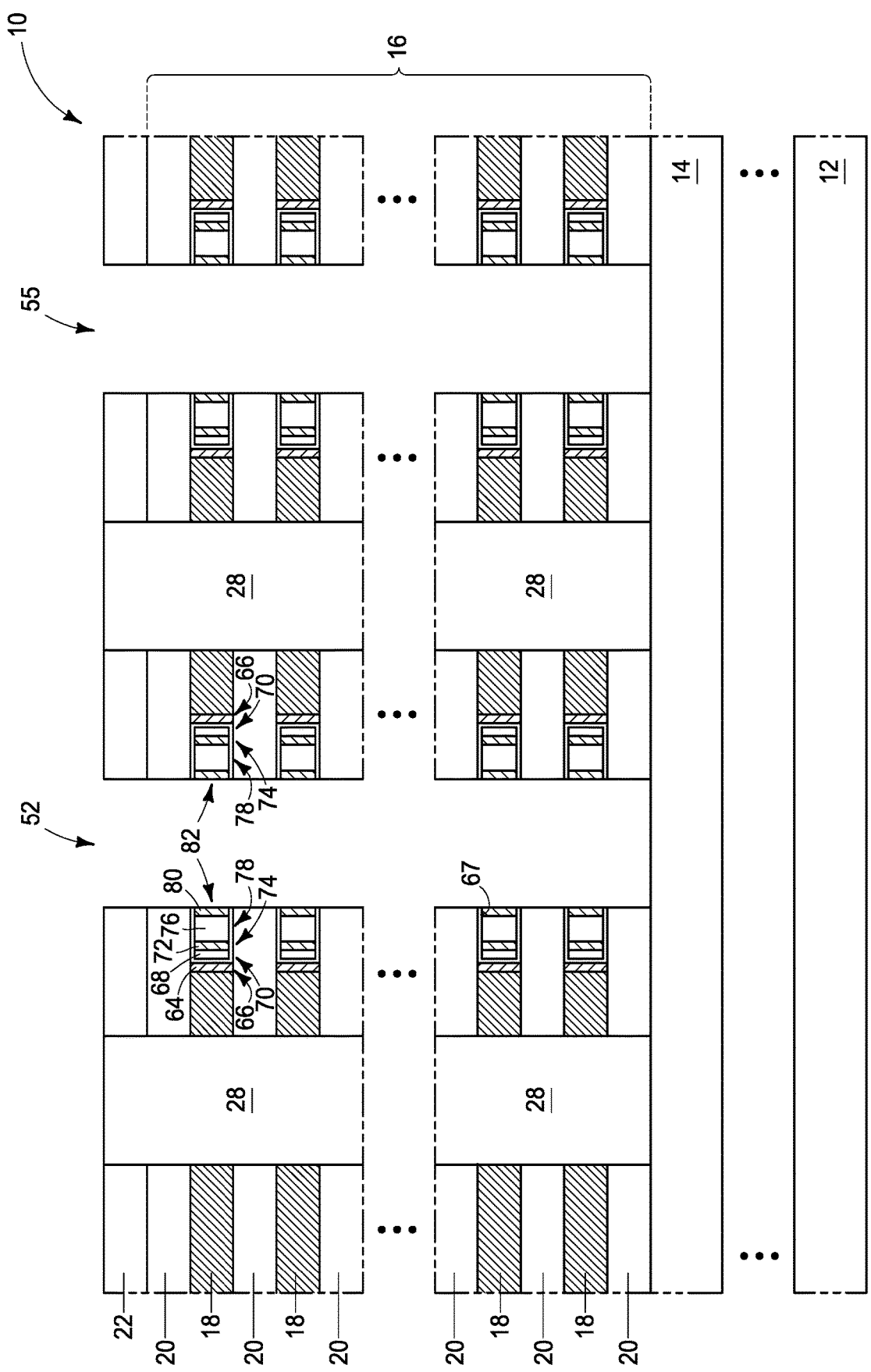
Figure 27:
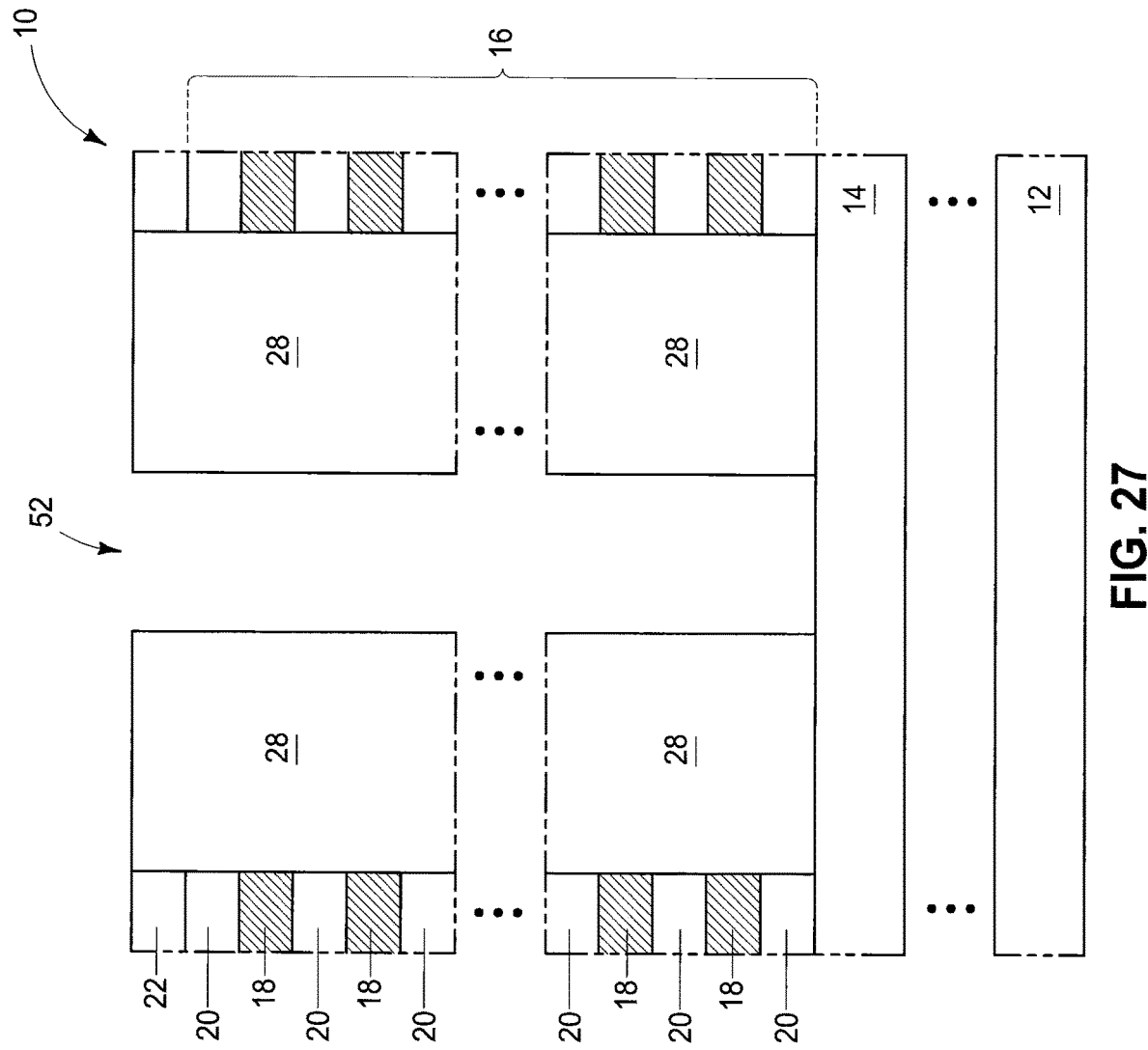

Referring to FIGS. 25-27, similar deposition and etchback methodologies to those described above relative to material 64 (i.e., the methodologies described above with reference to FIGS. 16-21) are utilized to deposit and pattern cell select device material 68 (only some of which is labeled), electrode material 72 (only some of which is labeled), phase change material 76 (only some of which is labeled), and electrode material 80 (only some of which is labeled).

The electrode materials 72 and 80 are patterned into electrodes 74 and 82, respectively within the cavities 60 (some of which are labeled in, for example, FIG. 20). The electrode 74 may be referred to as a middle electrode, and thus the electrode material 72 may be referred to as middle electrode material. The electrode 82 may be referred to as a second electrode in some embodiments, or as a top electrode; and thus the electrode material 80 may be referred to as second electrode material, or as top electrode material. The electrode materials 64, 72 and 80 may be the same composition as one another in some embodiments. In other embodiments, at least one of the electrode materials 64, 72 and 80 may be a different composition relative to at least one other of the electrode materials 64, 72 and 80. In some embodiments, all of the electrode materials 64, 72 and 80 comprise, consist essentially of, or consist of one or more of TiSiN, TiAlN, TiN, WN, Ti, C and W; where the formulas indicate the components within the listed compounds, rather than designating specific stoichiometries of such components.

The phase change material 76 is patterned into programmable units 78 (only some of which are labeled) within the cavities 60 (some of which are labeled in, for example, FIG. 20). The phase change material 76 may comprise any suitable composition or combination of compositions; and in some embodiments may be a chalcogenide. For instance, in some embodiments the phase change material may comprise one or more of germanium, antimony, tellurium and indium. The phase change material may, for example, comprise, consist essentially of, or consist of GeSbTe or InGeTe; where the formulas indicate the components within the listed compounds, rather than designating specific stoichiometries of such components.

The cell select device material 68 is patterned cell select devices 70 (only some of which are labeled) within the cavities 60 (some of which are labeled in, for example, FIG. 20). The cell select devices 70 may correspond to ovonic threshold switches in some embodiments. In such embodiments, the cell select device material 68 may comprise any suitable composition or combination of compositions; and in some embodiments may comprise, consist essentially of, or consist of one or more of germanium, arsenic, selenium, tellurium and silicon. The material 68 may, for example, comprise, consist essentially of, or consist of AsSe, AsSeGe, AsSeGeTe or AsGeTeSi; where the formulas indicate the components within the listed compounds, rather than designating specific stoichiometries of such components.

The relative thicknesses of materials 64, 68, 72, 76 and 80 may be tailored for specific applications. For instance, all of the electrode materials 64, 72 and 80 may be about the same thicknesses as one another (as shown), or in other embodiments at least one of the electrode materials may be thicker than at least one other of the electrode materials. Also, the phase change material 76 may be thicker than the cell select device material 68 (as shown), in other embodiments may be about the same thickness as the cell select device material, and in other embodiments may be thinner than the cell select device material.

Figure 28:
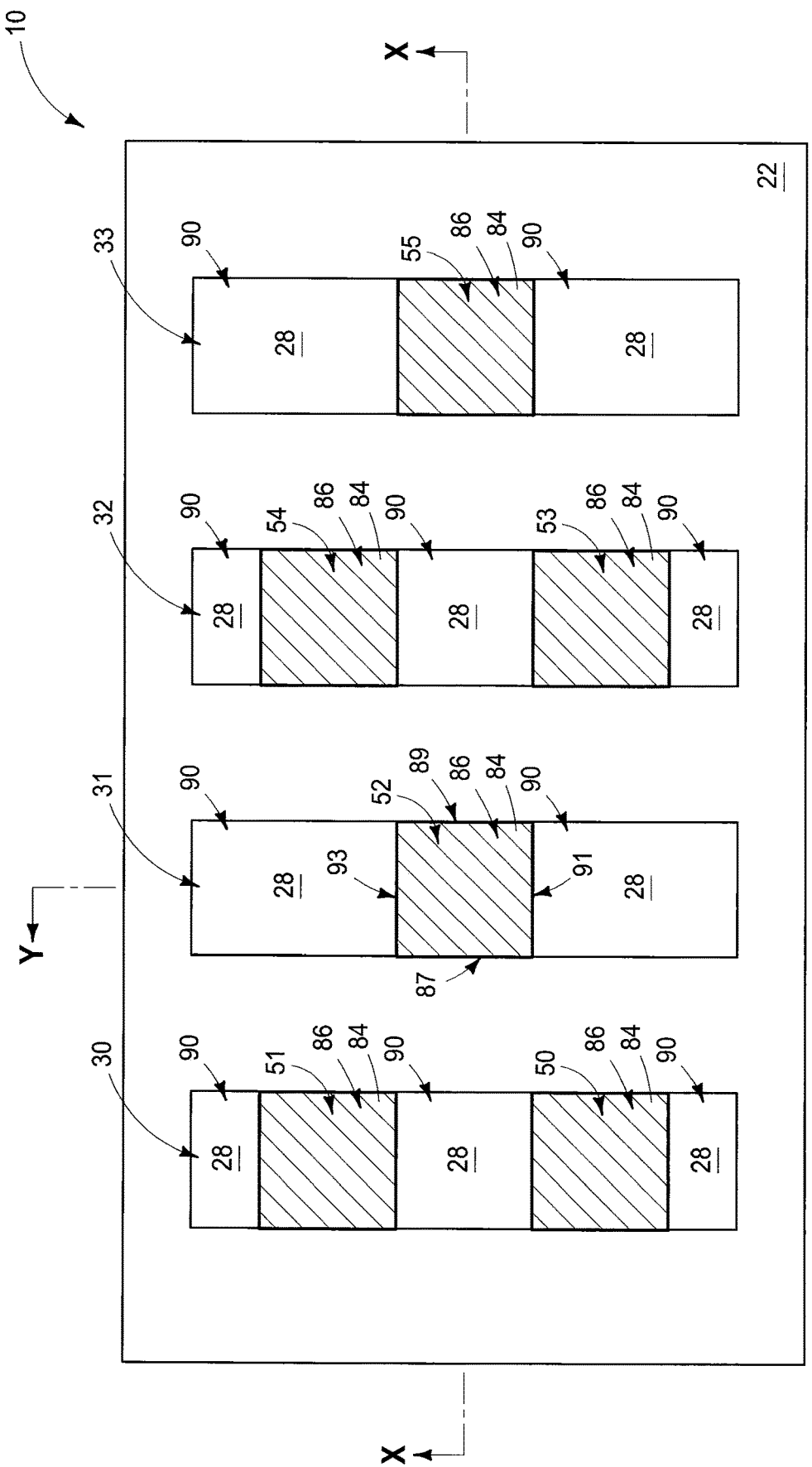
Figure 29:
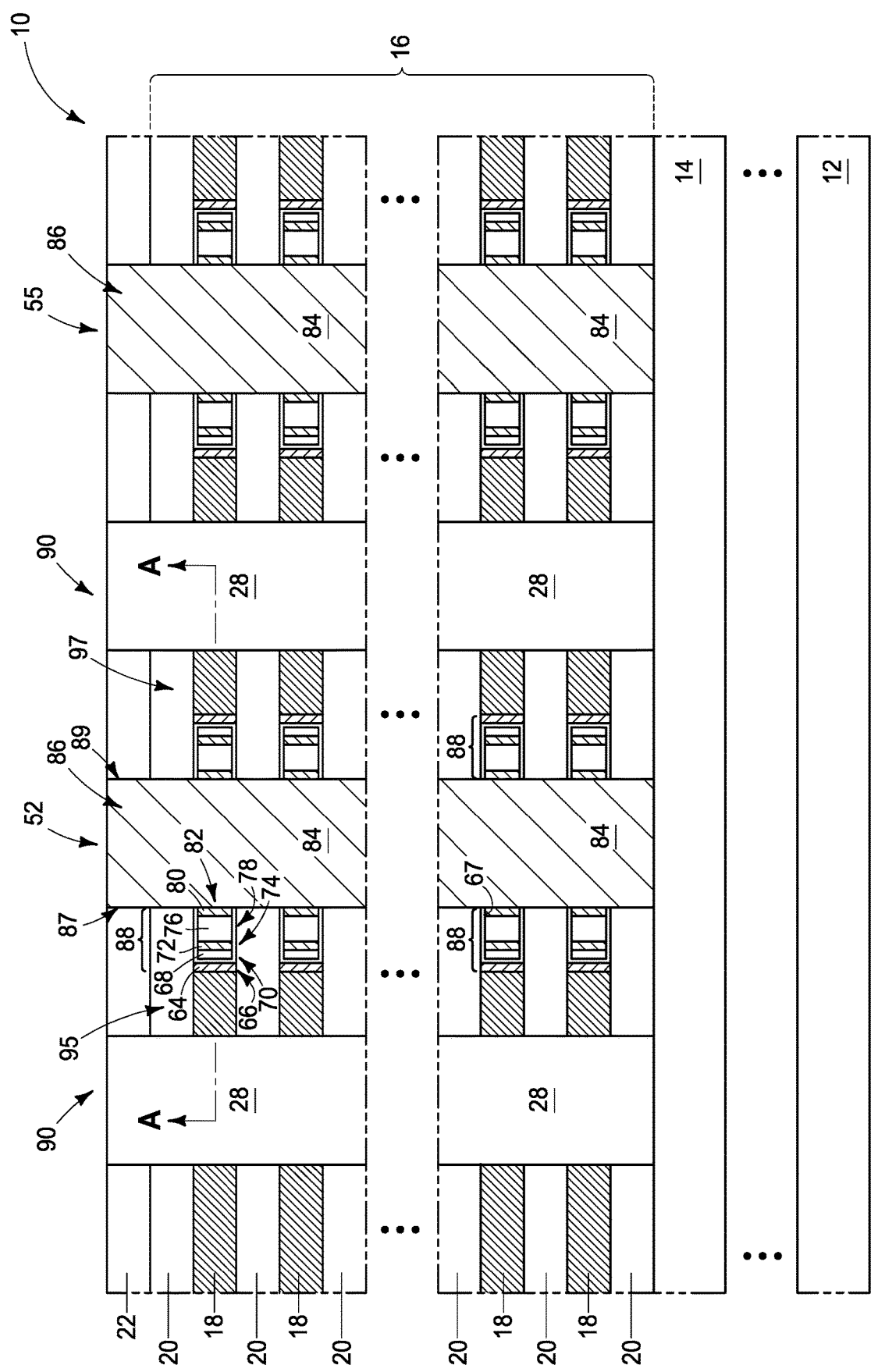
Figure 30:
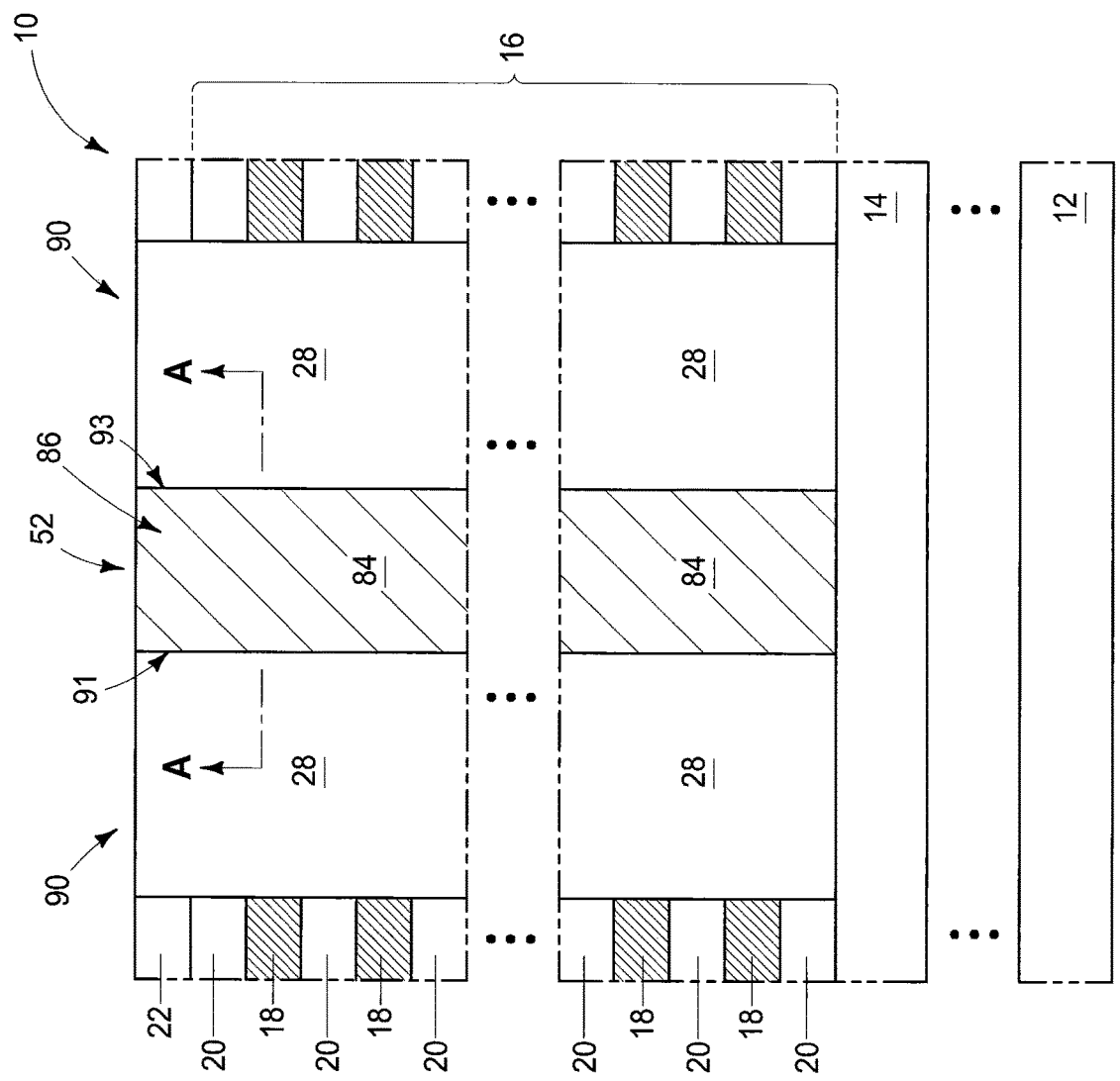

Referring to FIGS. 28-30, electrically conductive interconnect material 84 is formed within openings 50-55 and along the electrode material 82. In the shown embodiment, the material 84 entirely fills the openings 50-55. In other embodiments, the material 84 may line the openings or otherwise not entirely fill the openings.

The electrically conductive interconnect material 84 may comprise any suitable composition or combination of compositions; and in some embodiments may comprise, consist essentially of, or consist of one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, in some embodiments, the interconnect material may comprise, consist essentially of, or consist of tungsten.

In some embodiments, the interconnect material 84 may be patterned into bitlines 86 of a memory array, and in such embodiments the material 84 may be referred to as bitline material. In some embodiments, material 84 may be formed to overfill the openings 50-55, and the patterning of material 84 may comprise removal of excess material (for example, utilizing chemical-mechanical polishing) to leave the shown construction.

FIG. 29 shows that the electrodes 66, 74 and 82, together with the programmable units 78 and cell select devices 70 form a plurality of PCM cells 88 (only some of which are labeled in FIG. 29). The cells 88 may be considered to form a three-dimensional memory array; with rows of the array extending horizontally along the wordline levels 18, and with columns of the array comprising vertically-stacked cells along bitlines 86. In operation, each cell 88 may be uniquely addressed through the combination of a wordline and a bitline. In some embodiments, the interconnect material 84 within each of the openings 50-55 may be considered to form a bitline or other electrically conductive interconnect which electrically couples pluralities of the vertically-stacked memory cells 88 to one another.

The illustrated memory cells 88 are example memory cells, and in other embodiments other PCM cells may be formed. For instance, in some embodiments, one or both of the electrodes 66 and 82 may be omitted. As another example, in some embodiments the relative order of the programmable units 78 and cell select devices 70 may be reversed so that the cell select devices are formed after the programmable units, and thus are closer to the bitlines 86 than the programmable units. As another example, in some embodiments, the cell select devices 70 and middle electrodes 74 may be omitted.

In some embodiments, the first and second electrodes 66 and 82 within each memory cell 88 may be considered to be formed on opposing sides of the phase change material 76 within the memory cells. In the shown embodiment, the cell select devices 70 and middle electrodes 74 are also between the first and second electrodes, and the phase change material 76 is spaced from the cell select devices 70 by the middle electrodes 74.

In some embodiments, the construction 10 of FIGS. 28-30 may be considered to be a memory array having material 28 configured as electrically insulative pillars 90 extending through the stack 16. The construction further comprises bitlines 86 configured as conductive structures (e.g., wires) extending vertically through the stack 16, with the bitline structures being between the electrically insulative pillars 90. Each of the bitline structures may be considered to comprise a first pair of opposing sides 87 and 89 (shown relative to a bitline structure within opening 52), and a second pair of opposing sides 91 and 93 (also shown relative to the bitline structure within opening 52). In some embodiments, the bitline structures may be considered to be representative of electrically conductive interconnect structures that may be formed to extend vertically through the stack 16.

The individual sides of the first pair of opposing sides are spaced from adjacent pillars 90 by intervening regions of stack 16 (shown in FIG. 29, where intervening regions of the stack are labeled as a region 95 between side 87 and one of the pillars 90, and a region 97 between side 89 and another of the pillars 90).

Each of the second pair of opposing sides 91 and 93 does not have any of the materials of stack 16 between it and the adjacent pillars 90, as can be seen in FIG. 30.

The wordline levels 18 of the memory array of FIGS. 28-30 would be connected to other circuitry external of the memory array. Such connections may utilize any suitable landing pad structures, including, for example, so-called "shark-jaw" structures, "staircase" structures, etc. In some embodiments, (discussed below with reference to FIGS. 32-35), an elongated trench may be utilized to sub-divide the stack 16 and thereby simplify routing to landing pads and/or other circuitry.

In some embodiments, an electrode directly against the phase change material 76 (for instance, the electrode 74 in the shown embodiment) may correspond to a "heater" utilized to thermally induce a phase change within the programmable material. Such heater may consist essentially of, or consist of, TiSiN (where the formula indicates the components within the listed compound, rather than designating a specific stoichiometry of such components), in some embodiments.

Figure 31:
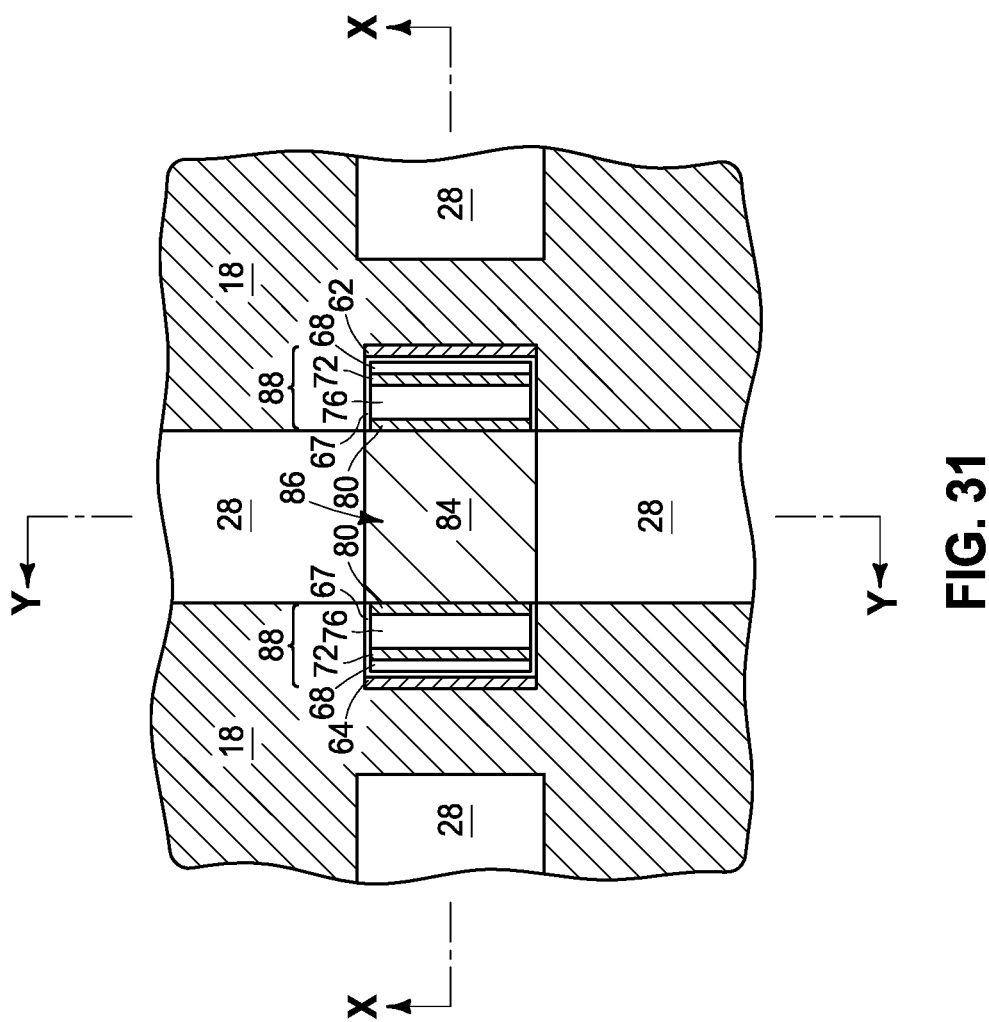
FIG. 31 is a diagrammatic view of a fragment along the lines A-A of FIGS. 29 and 30.

FIG. 31 shows an enlarged view of a fragment of the construction of FIGS. 28-30 (specifically, shows a view of the fragment along the line A-A of FIGS. 29 and 30), and shows two memory cells 88 on opposing sides of a bitline 86 relative to one another. The dielectric material 67 surrounds a lateral periphery of a region of the memory cell, and prevents shorting between wordline levels 18 and electrode materials 72 and 80.

Figure 32:
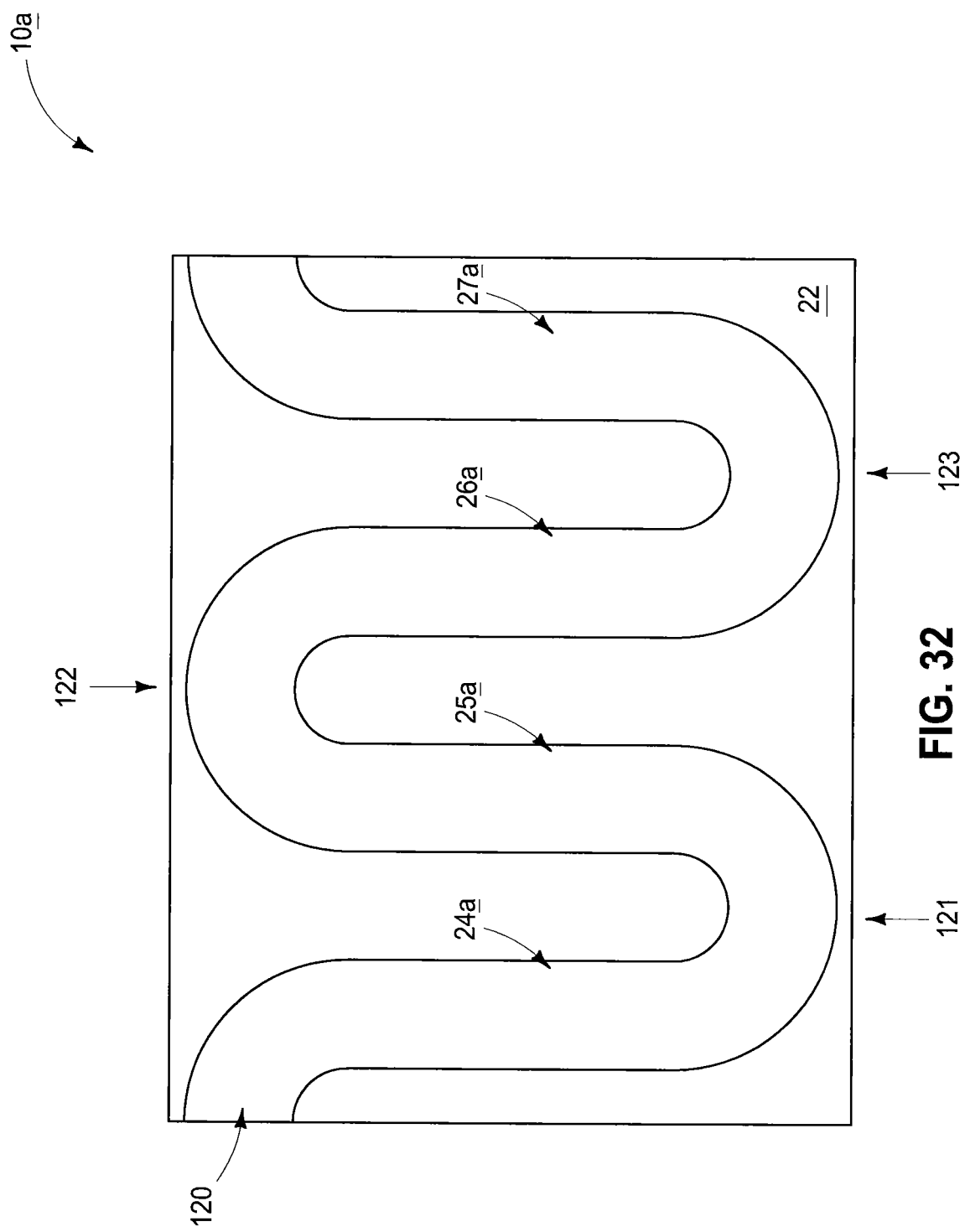
FIGS. 32-35 are top views of a portion of a semiconductor construction at various process stages of another example embodiment method of forming vertically-stacked structures; such as, for example, vertically-stacked PCM cells.

FIG. 32 shows a construction 10*a* at a processing stage analogous to that of FIG. 4. The construction comprises a single long trench 120 having linear regions 24*a*-27*a* in locations analogous to the locations of trenches 24-27 of FIG. 4. The trench 120 serpentines across construction 10*a*, with the linear regions 24*a*-27*a* being joined to one another through curved regions 121-123. In the shown embodiment, the linear regions 24*a*-27*a* are substantially parallel to one another.

Figure 33:
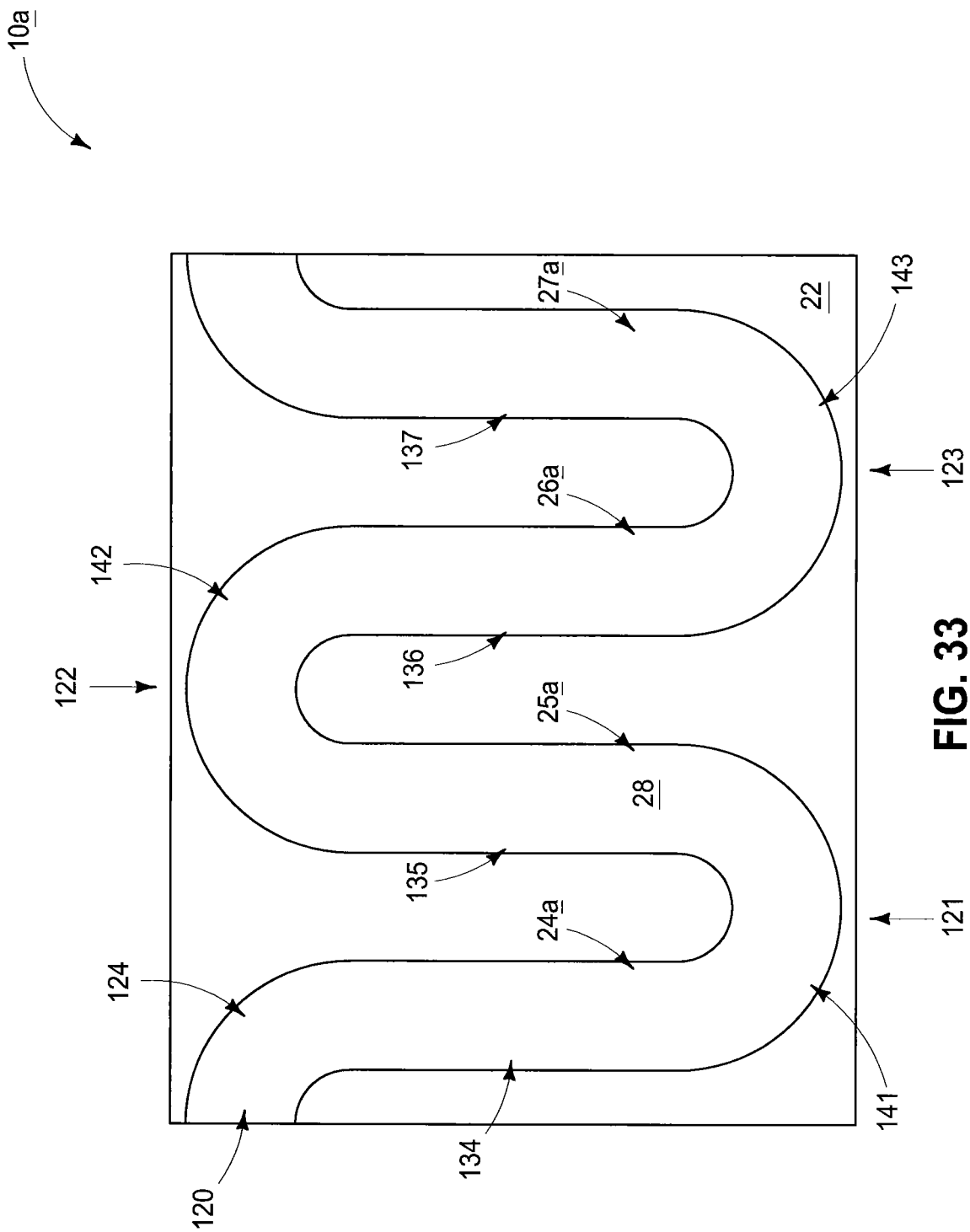

Referring to FIG. 33, the electrically insulative material 28 is formed within trench 120 with processing analogous to that described above with reference to FIG. 7. The electrically insulative material 28 forms a single long panel 124 within the trench 120. Such panel comprises linear regions 134-137 within the linear regions 24*a*-27*a* of trench 120. The linear regions 134-137 are joined to one another by curved regions 141-143 of the panel.

Figure 34:
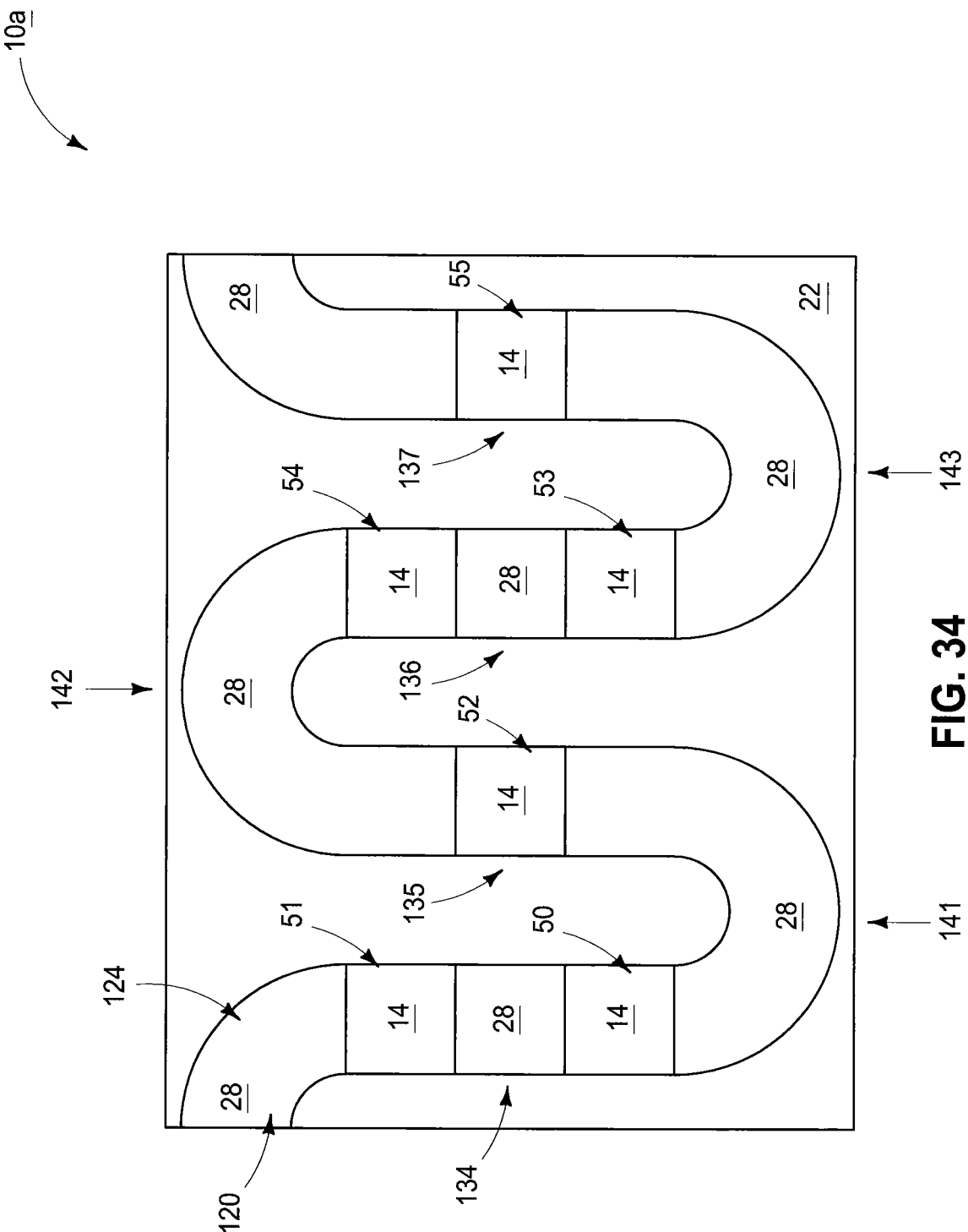

Referring to FIG. 34, the openings 50-55 are formed to extend through the panel 124 with processing analogous to that described above with reference to FIG. 10. In the shown embodiment, the openings are only formed within the linear regions 134-137 of the panel, and not within the curved regions 141-143.

Figure 35:
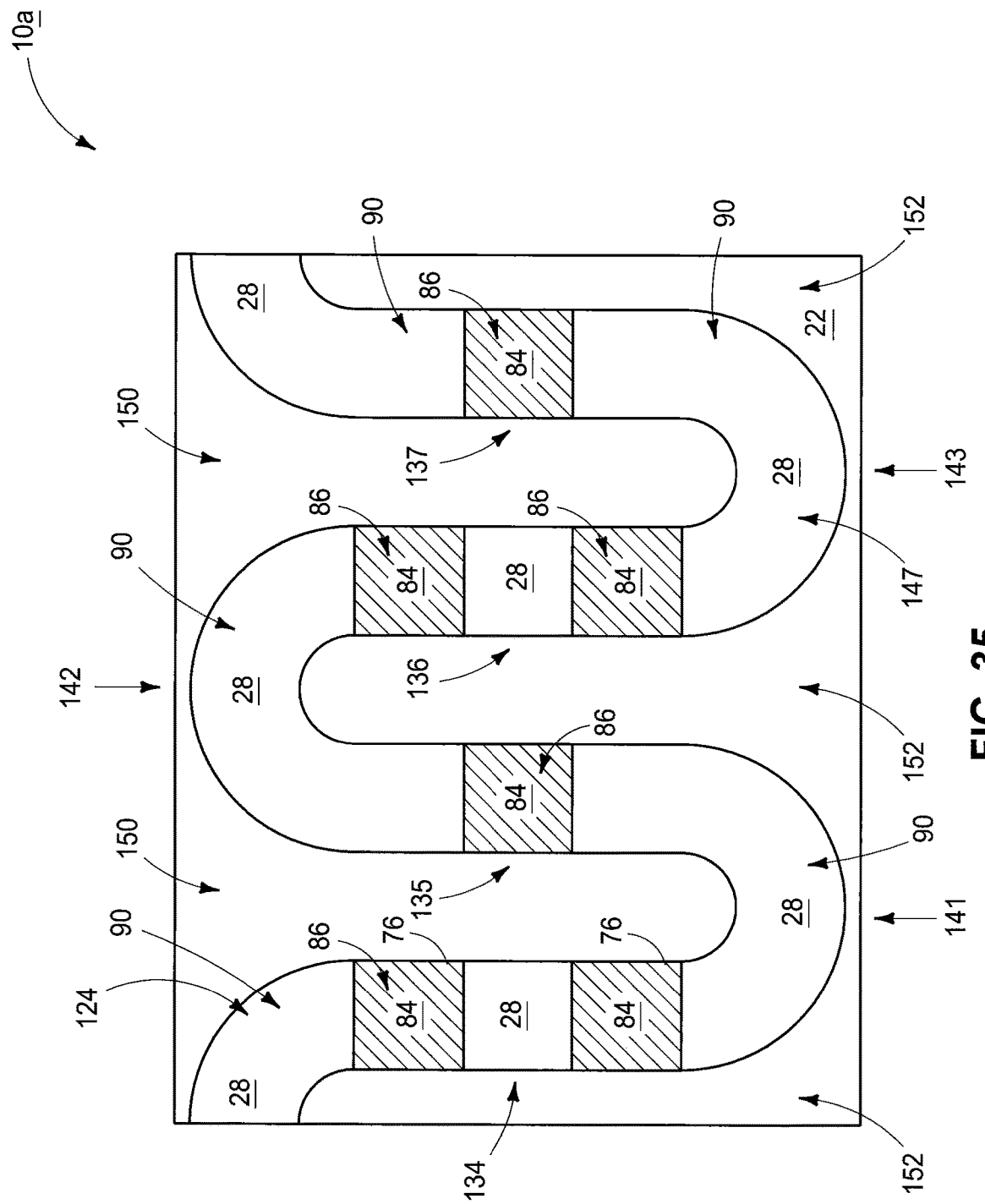

Referring to FIG. 35, the bitline material 84 is formed within openings 50-55 (FIG. 34) and patterned into bitlines 86. Accordingly, bitlines 86 and electrically insulative pillars 90 are incorporated into a serpentining structure 147. In the shown embodiment, the bitlines 86 are only within linear regions 134-137 of such serpentining structure.

An advantage of the embodiment of FIG. 35 is that the serpentining structure 147 can subdivide the wordline levels 18 (FIG. 29) into two separate groups. A first group is on a side 150 of the serpentining structure, and another group is on an opposing side 152 of the serpentining structure. The wordlines on side 150 may be considered to be a first set of wordlines, and those on side 152 may be considered to be a second set of wordlines. All of the wordlines within the first set that are at a common vertical level may be electrically coupled to one another, and electrically coupled to a common landing pad and/or to other common circuitry; and all of the wordlines within the second set that are at a common vertical level may be electrically coupled to one another, and electrically coupled to a common landing pad and/or to other common circuitry.

The serpentining structure 147 of FIG. 35 may be one of many substantially identical serpentining structures formed across a semiconductor construction during fabrication of a memory array.

Although the illustrated serpentining structure 147 has a single electrically insulative material 28 extending between the bitlines 86 and along the curved regions 141-143, in other embodiments two or more electrically insulative materials may be utilized instead of the single electrically insulative material 28. For instance, a different electrically insulative material may be utilized within the curved regions 141-143 than within linear regions between the bitlines 86.

The structures and memory arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The terms "dielectric" and "electrically insulative" are both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming memory. An opening is formed through a stack of alternating electrically conductive levels and electrically insulative levels. Cavities are formed to extend into the electrically conductive levels along the opening. Phase change material is formed within the cavities, and is incorporated into vertically-stacked memory cells. An electrically conductive interconnect is formed within the opening and is electrically coupled with a plurality of the vertically-stacked memory cells.

Some embodiments include a method of forming vertically-stacked structures. A stack of alternating electrically conductive levels and electrically insulative levels is formed. An electrically insulative panel is formed to extend through the stack. Some sections of the panel are removed while other sections are left remaining. Openings are formed where sections of the panel were removed. Each opening has a first pair of opposing sides along the stack, and has a second pair of opposing sides along remaining sections of the panel. Cavities are formed to extend into the electrically conductive levels along the first pair of opposing sides of the openings. Phase change material is formed within the cavities.

Some embodiments include a method of forming memory. A stack of alternating electrically conductive wordline levels and electrically insulative levels is formed. A trench is formed to extend through the stack. An electrically insulative panel is formed within the trench. Some sections of the panel are removed while other sections are left remaining. Openings are formed where sections of the panel were removed. Each opening has a first pair of opposing sides along the stack, and has a second pair of opposing sides along remaining sections of the panel. Cavities are formed to extend into the electrically conductive wordline levels along the first pair of opposing sides of the openings. First electrode material is formed along exposed edges of the electrically conductive wordline levels within the cavities. After the first electrode material is formed, phase change material is formed within the cavities; and then second electrode material is formed within the cavities. Electrically conductive bitline material is formed within the openings and is spaced from the phase change material by at least the second electrode material.

Some embodiments include a semiconductor construction. A stack of alternating electrically wordline conductive levels and electrically insulative levels is over a semiconductor base. Bitlines extend into the stack. Cavities extend into the electrically conductive levels along the bitlines. Phase change material is within the cavities.

Some embodiments include a semiconductor construction. A stack of alternating electrically conductive levels and electrically insulative levels is over a semiconductor base. Electrically insulative pillars extend through the stack. Interconnect material structures are between the pillars. The interconnect material structures have a first pair of opposing sides and a second pair of opposing sides. The first pair of opposing sides are spaced from adjacent pillars by intervening regions of the stack. None of the stack is between each of the sides of the second pair of opposing sides and pillars adjacent such sides of the second pair. Cavities extend into the electrically conductive levels along the first pair of opposing sides of the interconnect material structures. Phase change material is within the cavities.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
a stack of alternating wordline conductive levels and insulative levels over a semiconductor base;

a hardmask material over and in direct contact with an uppermost insulative level comprised by the stack;

a pair of insulative panels extending through the stack and along a first direction, the pair of insulative panels comprising an insulative material and comprising a first insulative panel and a second insulative panel separated from the first insulative panel along a second direction;

an opening extending through the first insulative panel; the opening having an outer perimeter that consists of first and second perimeter regions along the stack on opposing sides of the opening relative to one another, and third and fourth perimeter regions in opposing relation relative to one another, each of the third and fourth perimeter regions extending between the first and second perimeter regions and being along regions of the first insulative panel;

a planarized surface across the hardmask material and the insulative material;

a bitline extending into the opening, the bitline comprising a conductive material that contacts the first, second third and fourth regions of the perimeter;

cavities extending outwardly from the opening in the second direction into the conductive levels, a first set of the cavities extending from a first side of the opening toward the second insulative panel and a second set of the cavities extending from an opposing second side of the opening, the first set of cavities having a first vertical height extending through the conductive level and being spaced from the insulative material of the second insulative panel along the second direction by intervening conductive level material;

first electrodes within the cavities, the first electrodes having a first vertical length equivalent to the first vertical height; and phase change material within the cavities, the phase change material having a second vertical length that is less than the first vertical length.

2. The construction of claim 1 further comprising second electrodes within the cavities and on an opposing side of the phase change material relative to the first electrodes, the second electrodes having the second vertical length.

3. The construction of claim 2 further comprising cell select device material and middle electrode material within the cavities; and wherein the phase change material is spaced from the cell select device material by the middle electrode material.

4. The construction of claim 1 further comprising dielectric material lining the cavities, and wherein the phase change material is directly against the dielectric material lining the cavities.

5. A semiconductor construction comprising:
a stack of alternating electrically conductive levels and electrically insulative levels;
a hardmask material over the stack;
a plurality of electrically insulative panels that extends through the stack;
a first series of first openings extending through a first panel comprised by the plurality of electrically insulative panels, the first series extending along a first direction with each first opening having a first pair of opposing sides along the stack, and having a second pair of opposing sides along remaining sections of the first panel;
a second series of second openings extending through a second panel comprised by the plurality of electrically insulative panels, the second series extending along the first direction with each second opening having a first pair of opposing sides along the stack, and having a second pair of opposing sides along remaining sections of the second panel, each of the second openings being offset along the first direction relative to all of the first openings;
cavities extending laterally outward from the first pair of opposing sides of each of the openings with the second pair of opposing sides remaining intact, the cavities extending only partially into the electrically conductive levels between electrically insulative levels;
first electrode material within the cavities and directly contacting the electrically conductive levels, the first electrode material having a first vertical length;
phase change material within the cavities adjacent the first electrode material, the phase change material having a second vertical length that is less than the first vertical length;
second electrode material within the cavities adjacent the phase change material;
electrically conductive interconnects within the openings and directly contacting the second electrode material; and
cell select device material and middle electrode material within the cavities, the phase change material being spaced from the cell select device material by the middle electrode material.

* * * * *